(12) United States Patent
Yu et al.

(10) Patent No.: US 10,497,668 B2
(45) Date of Patent: Dec. 3, 2019

(54) INTEGRATED FAN-OUT PACKAGE INCLUDING VOLTAGE REGULATORS AND METHODS FORMING SAME

(71) Applicant: Taiwan Semiconductor Manufacturing Company, Ltd., Hsinchu (TW)

(72) Inventors: Chen-Hua Yu, Hsinchu (TW); Chih-Yuan Chang, Hsinchu (TW); Chuei-Tang Wang, Taichung (TW); Jeng-Shien Hsieh, Kaohsiung (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 0 days.

(21) Appl. No.: 16/223,700

(22) Filed: Dec. 18, 2018

(65) Prior Publication Data

US 2019/0123020 A1 Apr. 25, 2019

Related U.S. Application Data

(63) Continuation of application No. 15/822,695, filed on Nov. 27, 2017, now Pat. No. 10,163,852, which is a
(Continued)

(51) Int. Cl.
*H01L 21/44* (2006.01)
*H01L 23/00* (2006.01)
(Continued)

(52) U.S. Cl.
CPC ............ *H01L 24/98* (2013.01); *H01L 21/561* (2013.01); *H01L 23/3128* (2013.01);
(Continued)

(58) Field of Classification Search
CPC . H01L 21/561; H01L 23/3128; H01L 23/481; H01L 23/3675; H01L 23/5389;
(Continued)

(56) References Cited

U.S. PATENT DOCUMENTS 7,557,440 B2 7/2009 Yamamoto
7,701,057 B1 4/2010 Rahman et al.
(Continued)

FOREIGN PATENT DOCUMENTS

CN 102394227 A 3/2012
CN 104037153 A 9/2014
(Continued)

*Primary Examiner* — Luan C Thai
(74) *Attorney, Agent, or Firm* — Slater Matsil, LLP

(57) ABSTRACT

A method includes adhering a voltage regulator die over a carrier through a die-attach film, with the die-attach film being in the voltage regulator die and encircles metal pillars of the voltage regulator die, encapsulating the voltage regulator die in an encapsulating material, and planarizing the encapsulating material. A back portion of the voltage regulator die is removed to expose a through-via in a semiconductor substrate of the voltage regulator die. The method further includes forming first redistribution lines over the encapsulating material and electrically coupled to the through-via, replacing the die-attach film with a dielectric material, forming second redistribution lines on an opposite side of encapsulating material than the first redistribution lines, and bonding an additional device die to the second redistribution lines. The voltage regulator die is electrically coupled to the additional device die.

20 Claims, 31 Drawing Sheets

Related U.S. Application Data continuation of application No. 15/169,857, filed on Jun. 1, 2016, now Pat. No. 9,831,148.

(60) Provisional application No. 62/306,958, filed on Mar. 11, 2016.

(51) Int. Cl.

| | | |
|---|---|---|
| *H01L 23/48* | (2006.01) | |
| *H01L 23/31* | (2006.01) | |
| *H01L 21/56* | (2006.01) | |
| *H01L 23/367* | (2006.01) | |
| *H01L 23/538* | (2006.01) | |
| *H01L 25/00* | (2006.01) | |
| *H01L 23/498* | (2006.01) | |
| *H01L 21/48* | (2006.01) | |

(52) U.S. Cl.
CPC ........ *H01L 23/3675* (2013.01); *H01L 23/481* (2013.01); *H01L 23/5389* (2013.01); *H01L 24/02* (2013.01); *H01L 24/03* (2013.01); *H01L 24/16* (2013.01); *H01L 24/97* (2013.01); *H01L 25/00* (2013.01); *H01L 21/486* (2013.01); *H01L 21/568* (2013.01); *H01L 23/49816* (2013.01); *H01L 2224/04105* (2013.01); *H01L 2224/12105* (2013.01); *H01L 2224/18* (2013.01); *H01L 2224/2518* (2013.01); *H01L 2224/97* (2013.01); *H01L 2924/1427* (2013.01); *H01L 2924/181* (2013.01); *H01L 2924/18161* (2013.01)

(58) Field of Classification Search
CPC ......... H01L 24/98; H01L 24/16; H01L 24/03; H01L 24/97; H01L 24/02
USPC ........................................................ 438/667
See application file for complete search history.

(56) References Cited

U.S. PATENT DOCUMENTS

| | | | |
|---|---|---|---|
| 7,750,459 B2 | 7/2010 | Dang et al. | |
| 7,838,424 B2 | 11/2010 | Karta et al. | |
| 7,863,742 B2 | 1/2011 | Yu et al. | |
| 7,932,601 B2 | 4/2011 | Chang et al. | |
| 8,039,303 B2 | 10/2011 | Shim et al. | |
| 8,067,308 B2 | 11/2011 | Suthiwongsunthom et al. | |
| 8,252,629 B2 | 8/2012 | Yee et al. | |
| 8,269,337 B2 | 9/2012 | Hu et al. | |
| 8,361,842 B2 | 1/2013 | Yu et al. | |
| 8,680,647 B2 | 3/2014 | Yu et al. | |
| 8,703,542 B2 | 4/2014 | Lin et al. | |
| 8,754,508 B2 | 6/2014 | Chen et al. | |
| 8,754,514 B2 | 6/2014 | Yu et al. | |
| 8,759,964 B2 | 6/2014 | Pu et al. | |
| 8,772,151 B2 | 7/2014 | Chen | |
| 8,778,738 B1 | 7/2014 | Lin et al. | |
| 8,785,299 B2 | 7/2014 | Mao et al. | |
| 8,803,306 B1 | 8/2014 | Yu et al. | |
| 8,809,996 B2 | 8/2014 | Chen et al. | |
| 8,822,281 B2 | 9/2014 | Pagaila et al. | |
| 8,829,676 B2 | 9/2014 | Yu et al. | |
| 8,846,548 B2 | 9/2014 | Tu et al. | |
| 8,877,554 B2 | 11/2014 | Tsai et al. | |
| 8,993,377 B2 | 3/2015 | Koo et al. | |
| 9,048,222 B2 | 6/2015 | Hung et al. | |
| 9,048,233 B2 | 6/2015 | Wu et al. | |
| 9,087,835 B2 | 7/2015 | Sutardja et al. | |
| 9,543,170 B2 | 1/2017 | Yu et al. | |
| 9,627,365 B1 | 4/2017 | Yu et al. | |
| 9,633,974 B2 * | 4/2017 | Zhai ................... H01L 25/0652 | |
| 9,735,134 B2 | 8/2017 | Chen | |
| 9,741,689 B2 | 8/2017 | Chang et al. | |
| 9,831,224 B2 | 11/2017 | Lin et al. | |
| 2010/0072961 A1 | 3/2010 | Kosonocky et al. | |
| 2011/0291288 A1 | 12/2011 | Wu et al. | |
| 2011/0317387 A1 | 12/2011 | Pan et al. | |
| 2012/0112352 A1 | 5/2012 | Chi et al. | |
| 2013/0026468 A1 | 1/2013 | Yoshimuta et al. | |
| 2013/0062760 A1 | 3/2013 | Hung et al. | |
| 2013/0062761 A1 | 3/2013 | Lin et al. | |
| 2013/0168848 A1 | 7/2013 | Lin et al. | |
| 2013/0292846 A1 | 11/2013 | Lee et al. | |
| 2013/0307140 A1 | 11/2013 | Huang et al. | |
| 2013/0341800 A1 | 12/2013 | Tu et al. | |
| 2014/0015122 A1 | 1/2014 | Chou et al. | |
| 2014/0045379 A1 | 2/2014 | Chen | |
| 2014/0048926 A1 | 2/2014 | Wang et al. | |
| 2014/0077356 A1 | 3/2014 | Chen et al. | |
| 2014/0183693 A1 | 7/2014 | Tsai et al. | |
| 2014/0187103 A1 | 7/2014 | Chen et al. | |
| 2014/0203429 A1 | 7/2014 | Yu et al. | |
| 2014/0225222 A1 | 8/2014 | Yu et al. | |
| 2014/0252558 A1 | 9/2014 | Yu et al. | |
| 2014/0252597 A1 | 9/2014 | Tsai et al. | |
| 2014/0252601 A1 | 9/2014 | Lu et al. | |
| 2014/0252608 A1 | 9/2014 | Chen et al. | |
| 2014/0252646 A1 | 9/2014 | Hung et al. | |
| 2014/0262468 A1 | 9/2014 | Chen et al. | |
| 2014/0264885 A1 | 9/2014 | Tsai et al. | |
| 2014/0264930 A1 | 9/2014 | Yu et al. | |
| 2014/0306355 A1 | 10/2014 | Meyer et al. | |
| 2016/0190113 A1 | 6/2016 | Sharan et al. | |
| 2016/0358889 A1 | 12/2016 | Lai et al. | |

FOREIGN PATENT DOCUMENTS

| | | |
|---|---|---|
| CN | 105374693 A | 3/2016 |
| KR | 20130018090 A | 2/2013 |
| KR | 20130133166 A | 12/2013 |
| KR | 20150105183 A | 9/2015 |
| KR | 20150106815 A | 9/2015 |

* cited by examiner

INTEGRATED FAN-OUT PACKAGE INCLUDING VOLTAGE REGULATORS AND METHODS FORMING SAME

PRIORITY CLAIM AND CROSS-REFERENCE

This application is a continuation of U.S. patent application Ser. No. 15/822,695, entitled "Integrated Fan-out Package Including Voltage Regulators and Methods Forming Same," filed on Nov. 27, 2017, which is a continuation of U.S. patent application Ser. No. 15/169,857 entitled "Integrated Fan-out Package Including Voltage Regulators and Methods Forming Same," filed on Jun. 1, 2016, now Pat. No. 9,831,148, issued on Nov. 28, 2017, which claims the benefit of the following provisionally filed U.S. Patent application: Application Ser. No. 62/306,958, filed Mar. 11, 2016, and entitled "System and methods of InFO Ultra-High Performance (InFO_UHP) Package for Integration of SOC, HBM, and VR," which applications are hereby incorporated herein by reference.

BACKGROUND

In integrated circuits, some circuit components such as System-On-Chip (SOC) dies and Central Processing Units (CPU) have high requirement to the Input/output (IO) and power consumption. For example, a CPU may include a plurality of cores, and needs to consume a considerable amount of power. On the other hand, the requirement to the provided power is also high. For example, the power supply voltages need to be very stable. Accordingly, a plurality of voltage regulators may be connected to the CPU chip and the SOC dies to provide power.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
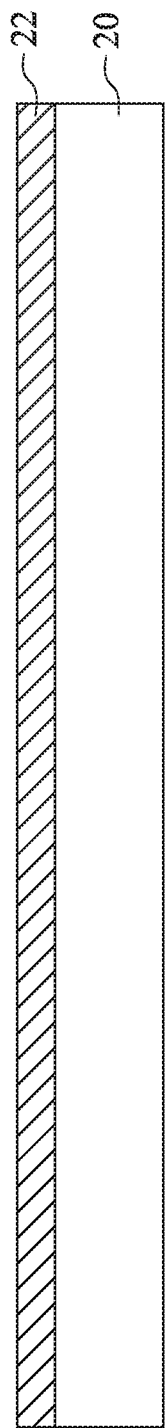
FIGS. 1 through 20 illustrate the cross-sectional views of intermediate stages in the formation of a package including voltage regulators in accordance with some embodiments.

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "underlying," "below," "lower," "overlying," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

An Integrated Fan-Out (InFO) package and the method of forming the same are provided in accordance with various exemplary embodiments. The InFO package may be used for improving the performance of power supply. The intermediate stages of forming the package are illustrated in accordance with some embodiments. Some variations of some embodiments are discussed. Throughout the various views and illustrative embodiments, like reference numbers are used to designate like elements.

Figure 31:
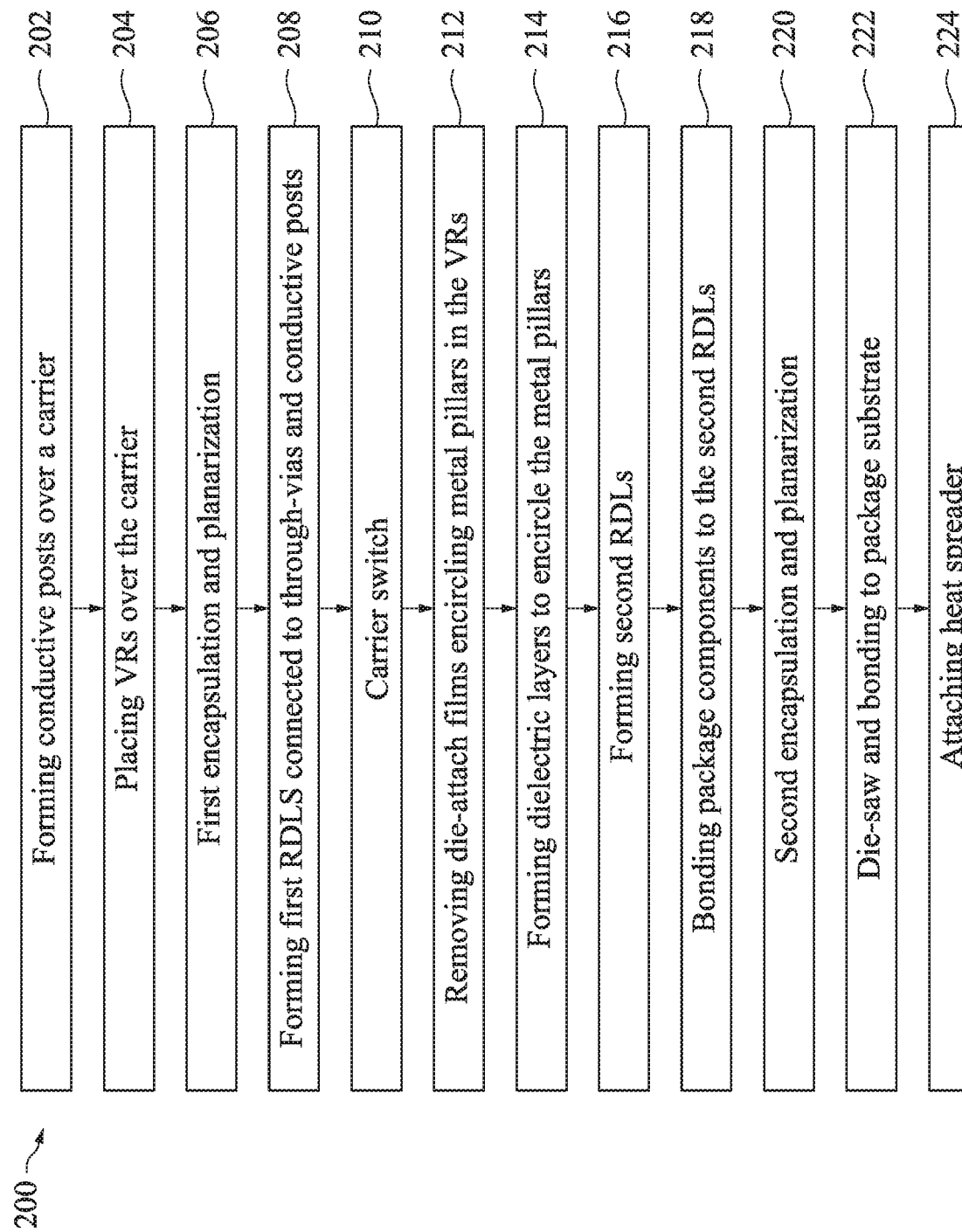
FIG. 31 illustrates a process flow for forming a package in accordance with some embodiments.

FIGS. 1 through 20 illustrate the cross-sectional views of intermediate stages in the formation of a multi-tier package in accordance with some embodiments. The steps shown in FIGS. 1 through 20 are also illustrated schematically in the process flow 200 shown in FIG. 31.

Referring to FIG. 1, carrier 20 is provided, and base layer 22 is disposed over carrier 20. Carrier 20 may be a blank glass carrier, a blank ceramic carrier, an organic carrier, or the like, and may have a shape of a semiconductor wafer with a round top-view shape. Carrier 20 is sometimes referred to as a carrier wafer. In accordance with some embodiments, there is a Light-to-Heat Conversion (LTHC) layer (not shown) between base layer 22 and carrier 20. The LTHC is capable of decomposing under the heat of light, and hence can be used to separate base layer 22 from carrier 20 in subsequent steps. In accordance with some embodiments of the present disclosure, base layer 22 is formed of a resin-based and/or polymer-based material such as polyimide, polybenzoxazole (PBO), or the like.

Figure 2:
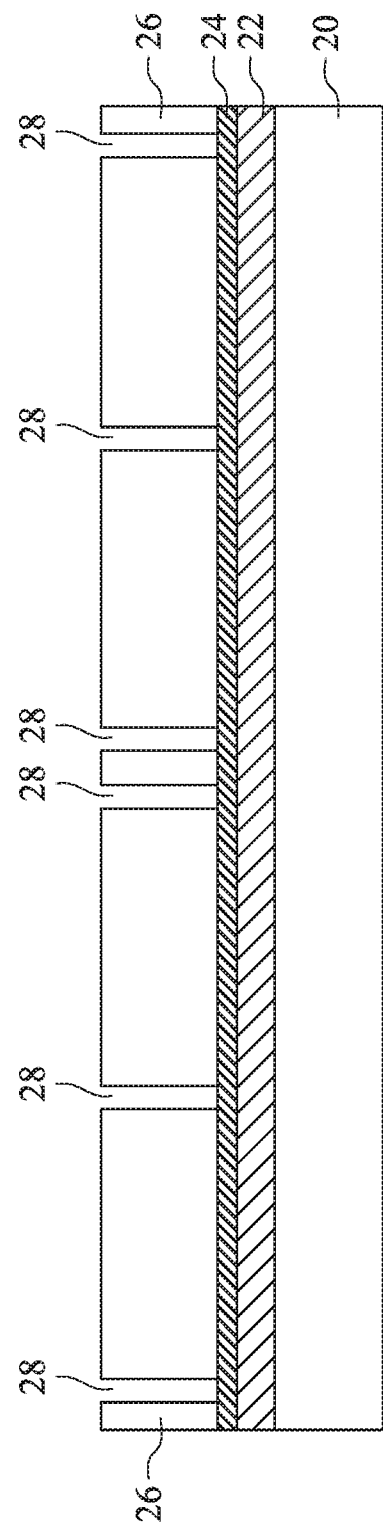
Figure 3:
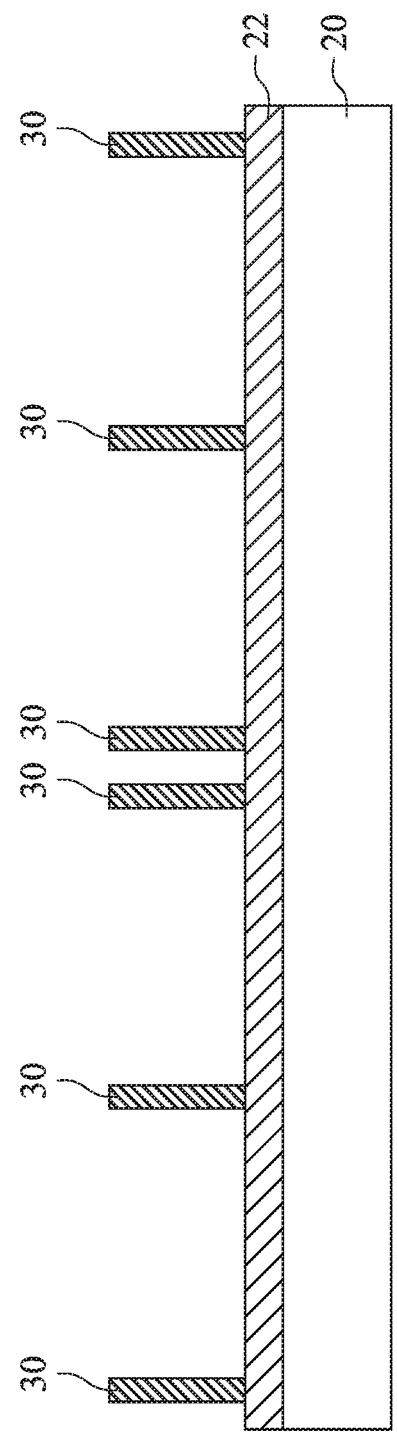

FIGS. 2 and 3 illustrate the formation of conductive posts in accordance with some embodiments of the present disclosure. The respective step is shown as step 202 in the process shown in FIG. 31. Referring to FIG. 2, seed layer 24 is formed over base layer 22, for example, through Physical Vapor Deposition (PVD) or metal foil lamination. Seed layer 24 may be formed of copper, aluminum, titanium, or multi-layers thereof. In accordance with some embodiments of the present disclosure, seed layer 24 includes a titanium layer (not separately shown) and a copper layer (not separately shown) over the titanium layer. In accordance with alternative embodiments, seed layer 24 includes a single copper layer.

Photo resist 26 is applied over seed layer 24 and is then patterned, and openings 28 are formed in photo resist 26 by light-exposure and development steps. As a result, some portions of seed layer 24 are exposed through openings 28.

Next, conductive posts 30 are formed in openings 28 through plating, which may be electro plating or electro-less plating, as shown in FIG. 3. Conductive posts 30 are plated on the exposed portions of seed layer 24 in FIG. 2. Conductive posts 30 may include copper, aluminum, tungsten, nickel, or alloys thereof. The top-view shapes of conductive posts 30 include, and are not limited to, spirals, rings, rectangles, squares, circles, and the like, depending on the intended function of conductive posts 30 and available space. The heights of conductive posts 30 are determined by the thickness of the subsequently placed integrated circuit chips.

After the plating of conductive posts 30, photo resist 26 (FIG. 2) is removed, and the resulting structure is shown in FIG. 3. The portions of seed layer 24 (FIG. 2) that were previously covered by photo resist 26 are exposed. An etch step is then performed to remove the exposed portions of seed layer 24, wherein the etching may be an anisotropic or isotropic etching. The portions of seed layer 24 that are overlapped by conductive posts 30, on the other hand, remain not etched. Throughout the description, the remaining underlying portions of seed layer 24 are considered as being the bottom portions of conductive posts 30. When seed layer 24 is formed of a material similar to or the same as that of the respective overlying conductive posts 30, seed layer 24 may be merged with conductive posts 30 with no distinguishable interface therebetween. Accordingly, seed layer 24 is not shown in subsequent drawings. In accordance with alternative embodiments of the present disclosure, there exist distinguishable interfaces between seed layer 24 and the overlying plated portions of conductive posts 30.

Figure 4:
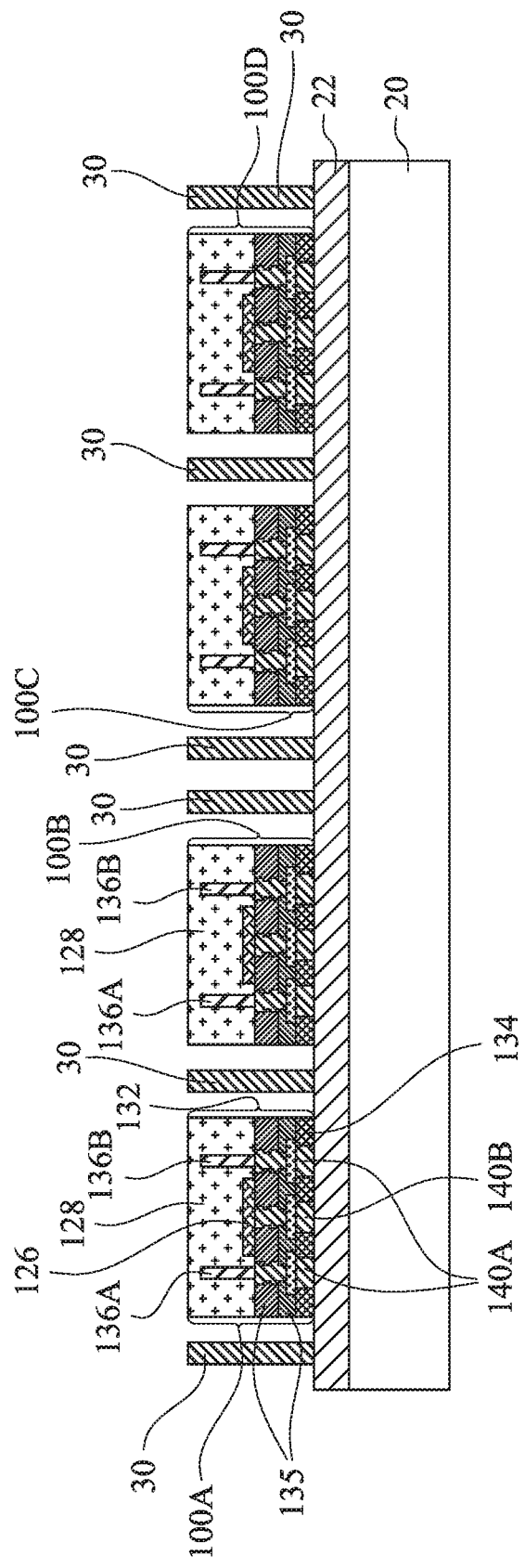

Referring to FIG. 4, device dies 100 (including 100A, 100B, 100C, and 100D, which are collectively referred to as device dies 100) are placed over base layer 22. In accordance with some embodiments of the present disclosure, device dies 100 are Voltage Regulator (VR) dies, which include voltage regulators for regulating voltage supplies for the overlying dies. The circuits in the VRs are schematically illustrated as 126, which are formed on semiconductor substrate 128. The placement of device dies 100 is shown as step 204 in the process shown in FIG. 31. It is appreciated that the subsequently discussed process steps are performed at wafer level. Accordingly, there is a plurality of die groups identical to the die group including device dies 100A, 100B, 100C, and 100D. It is appreciated that although four VR dies are illustrated, the number of VR dies may be any number. The plurality of die groups may be arranged as an array including a plurality of rows and a plurality of columns. Some or all of device dies 100 may be identical to each other or different from each other in any combination.

VR circuits 126 may include analog pump circuits, digital control blocks, and other circuits that are used for regulating voltages. The analog pump circuits are used for pumping currents into, for example, the overlying logic dies. The digital control blocks have the function of determining when the analog circuits need to pump currents. The digital control blocks, when used in advanced VR, can determine how many phases of the analog pumps need to be turned on in order to optimize current output to the overlying device dies. In addition, device dies 100 may also include built-in inductors electrically coupled to the analog pump circuits and the digital control blocks.

In accordance with some embodiments of the present disclosure, some or all of device dies 100 are stand-alone VR dies, wherein no other logic circuits other than those are used by voltage regulator circuits are built in device dies 100. In accordance with alternative embodiments, some logic circuits or memory circuits are built inside some or all device dies 100 along with the voltage regulator circuits.

Device dies 100 include semiconductor substrates 128, which may be silicon substrates, silicon carbon substrates, III-V compound semiconductor substrates, or the like. Device dies 100 also include interconnect structures 132. In accordance with some embodiments of the present disclosure, interconnect structure 132 includes a plurality of dielectric layers 135, and metal lines and vias in dielectric layers 135. Dielectric layers 135 may include Inter-Metal Dielectric (IMD) layers, which may be formed of low-k dielectric materials having dielectric constants (k values) lower than about 3.5, lower than about 3.0, or lower than about 2.5, for example. Also, close to the front surfaces (the illustrated bottom surfaces) of device dies 100, there may be non-low-k passivation layers such as silicon nitride layers, silicon oxide layers, Un-doped Silicate Glass (USG) layers, and/or polymer layers. Furthermore, at the surface of interconnect structure 132 reside metal pillars 140 (including 140A and 140B) in a surface dielectric layer 134. Metal pillars 140 may be copper-containing pillars/pads, aluminum-containing pillars/pads, or the like. In accordance with some embodiments, the illustrated bottom surface of dielectric layer 134 is coplanar with the bottom surfaces of metal pillars 140. In accordance with some embodiments, dielectric layer 134 is a die-attach film, which is an adhesive, through which device dies 100 are adhered to base layer 22. Die-attach film 134 encircles metal pillars 140.

The built-in inductors (not shown, if any) may be embedded in interconnect structures 132, and are also parts of the voltage regulator circuits. The inductors may be formed using metal lines and vias that are interconnected to have a shape of coils. Accordingly, in accordance with some embodiments of the present disclosure, the inductors are on-chip inductors integrated in the same chips as the VR circuits. In accordance with alternative embodiments of the present disclosure, the inductors are formed outside of VR dies 100 as stand-alone inductors.

Device dies 100 also include through-vias (alternatively referred to as through-silicon vias or through-substrate vias) 136 (include 136A and 136B). Through-vias 136 may extend to an intermediate level between the top surface and the bottom surface of semiconductor substrate 128. Each of through-vias 136 is electrically insulated from the respective semiconductor substrates 128 by a dielectric layer (not shown) that encircles the respective through-via 136.

In accordance with some embodiments of the present disclosure, through-vias 136 are used to interconnect the conductive features on opposite sides of semiconductor substrate 128. In accordance with alternative embodiments, no through-via is formed to penetrate through semiconductor substrate 128. When formed, through-vias 136 may be used solely for interconnecting the features on opposite sides of device dies 100, and/or for connecting to the circuits in device dies 100. For example, through-vias 136B may be electrically coupled to devices 126 (such as the VR circuits, inductors, etc.,) inside the respective device dies 100. Through-vias 136B may also be electrically coupled to metal pillars 140B. Through-vias 136A in a device die 100, on the other hand, are solely used for connecting the conductive features (such as in device dies 66A, 66B, and 66C in FIG. 20) over the respective device die 100 to the conductive features (such as the metal pads in package component 76 in FIG. 20) underlying device dies 100. In accordance with some exemplary embodiments, through-vias 136A are not connected to any other circuits (including active devices such as transistors and diodes and passive devices such as capacitors, inductors, resistors, etc.) inside device die 100. Accordingly, through-vias 136A are solely used for interconnecting the features outside of device dies 100, and are not used for the inner connection to the circuits inside device dies 100. Alternatively stated, through-vias 136A has the same function as conductive posts 30. Advantageously, forming through-vias 136A inside device dies 100 incurs no additional manufacturing cost since they are formed simultaneously as through-vias 136B. In addition, since through-vias 136A are formed using the technology for forming device dies, through-vias 136 may have much higher density and smaller sizes than conductive posts, and the total count of through-vias 136A that can be accommodated in the respective package may be much higher than conductive posts 30. Accordingly, forming through-vias 136A is a beneficial addition to conductive posts 30.

Each of through-vias 136A is connected to one of conductive paths that electrically couples the respective through-vias 136A to a metal pillar 140A. The conductive paths may include metal lines/pads and metal vias in dielectric layers. The conductive paths may be single-route paths that have no branches/forks, and are not connected to any other metal pillar 140B, inductor, resistor, capacitor, transistors, diodes etc., in the respective device die 100. Accordingly, through-vias 136A, although residing in device dies 100, are not involved in the voltage/signal transferring that is related to voltage regulation.

Figure 5:
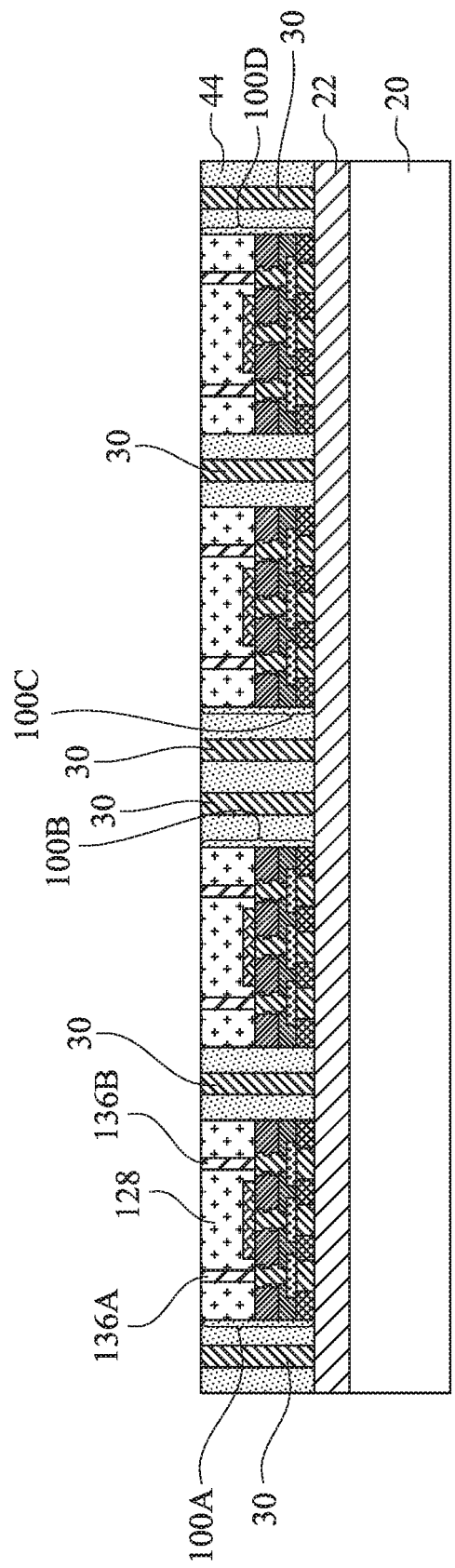

Referring to FIG. 5, device dies 100 are encapsulated in encapsulating material 44. The respective step is shown as step 206 in the process shown in FIG. 31. Encapsulating material 44 is dispensed and then cured, for example, in a thermal curing process. Encapsulating material 44 fills the gaps between device dies 100, and may be in contact with base layer 22. Encapsulating material 44 may include a molding compound, a molding underfill, an epoxy, and/or a resin. After the encapsulation process, the top surface of encapsulating material 44 is higher than device dies 100.

Next, a planarization step such as a Chemical Mechanical Polish (CMP) step or a grinding step is performed to planarize encapsulating material 44, and to expose conductive posts 30. Portions of substrates 128 of device dies 100 are also removed, until through-vias 136 of device dies 100 are exposed. Due to the planarization, the top surfaces of through-vias 136 are substantially level (coplanar) with the top surface of encapsulating material 44.

Figure 6:
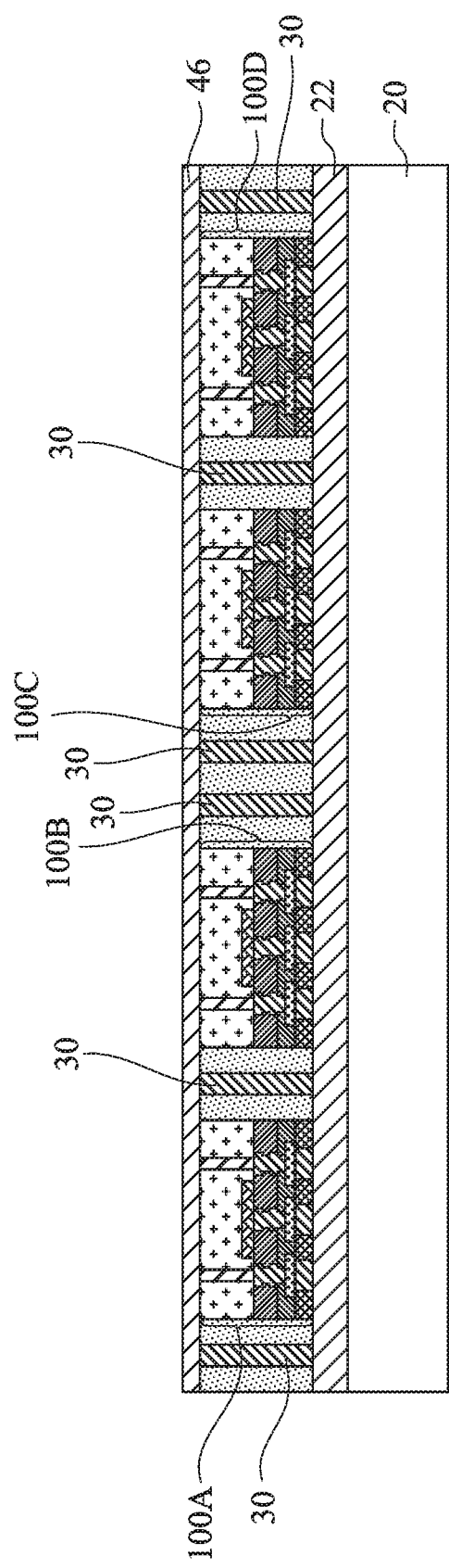
Figure 7:
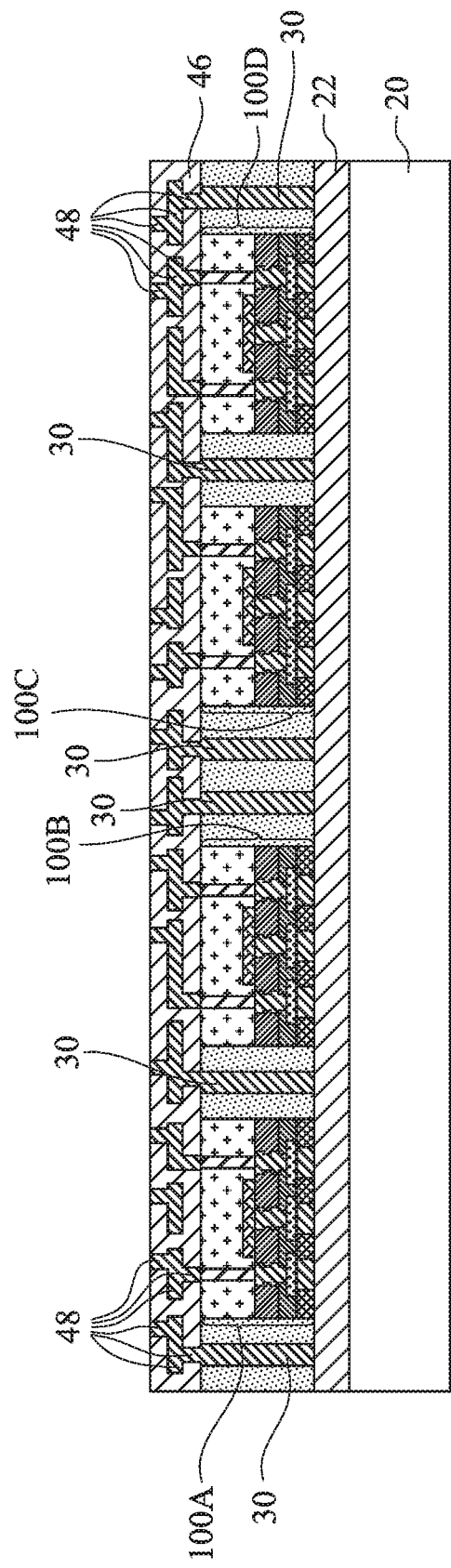
Figure 8:
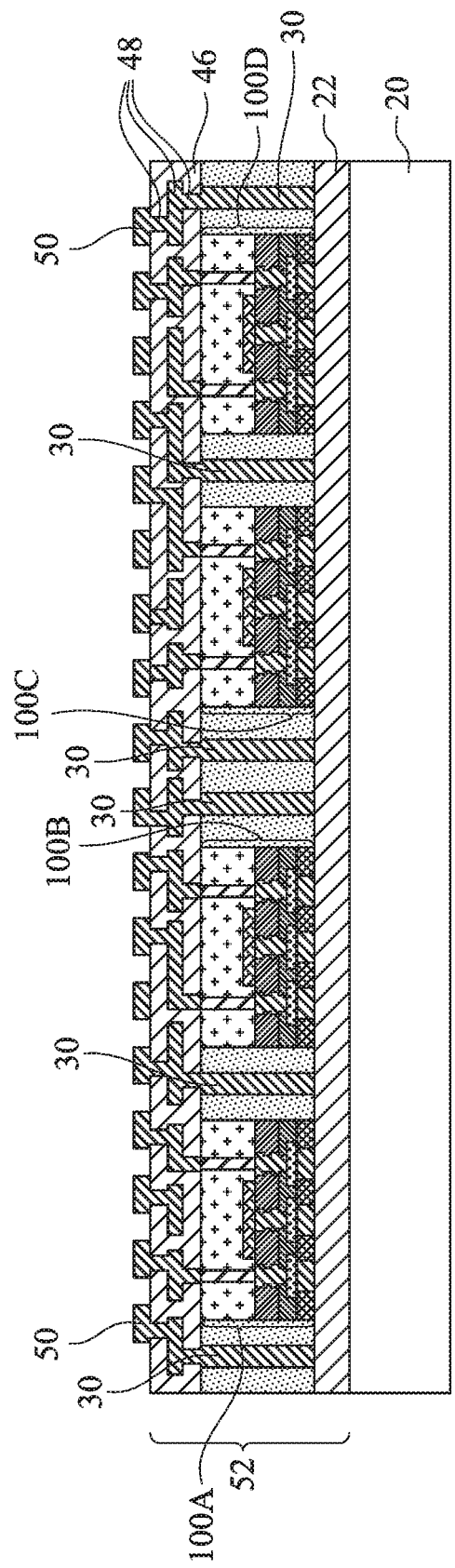

FIGS. 6 through 8 illustrate the formation of back-side Redistribution Lines (RDLs) on the backside of device dies 100. The respective step is shown as step 208 in the process shown in FIG. 31. Referring to FIG. 6, dielectric layer 46 is formed to cover device dies 100 and encapsulating material 44. Next, as shown in FIG. 7, RDLs 48 are formed to penetrate through dielectric layer 46 as shown in FIG. 6. More dielectric layers 46 may also be formed. In accordance with some embodiments of the present disclosure, dielectric layers 46 are formed of a polymer(s) such as PBO, polyimide, or the like. In accordance with alternative embodiments of the present disclosure, dielectric layers 46 are formed of an inorganic dielectric material(s) such as silicon nitride, silicon oxide, silicon oxynitride, or the like.

RDLs 48 are formed to electrically couple to through-vias 136 and conductive posts 30. RDLs 48 may include metal traces (metal lines) and vias underlying and connected to the respective metal traces. In accordance with some embodiments of the present disclosure, RDLs 48 are formed through plating processes, wherein each of RDLs 48 includes a seed layer (not shown) and a plated metallic material over the seed layer. The seed layer and the plated metallic material may be formed of the same material or different materials. During the formation of RDLs 48, dielectric layers 46 are patterned to form via openings (occupied by RDLs 48), and upper-level RDLs 48 extend into the via openings to contact lower-level RDLs 48. In addition, some of RDLs 48 may be in physical contact with through-vias 136 in device dies 100 and conductive posts 30.

Referring to FIG. 8, Under-Bump Metallurgies (UBM) 50 (or metal pads) are formed to connect to RDLs 48. UBMs 50 may include titanium, copper, nickel, or the like. The resulting structure including base layer 22, device dies 100, encapsulating material 44 and the overlying features is referred to as composite wafer 52 hereinafter.

Figure 9:
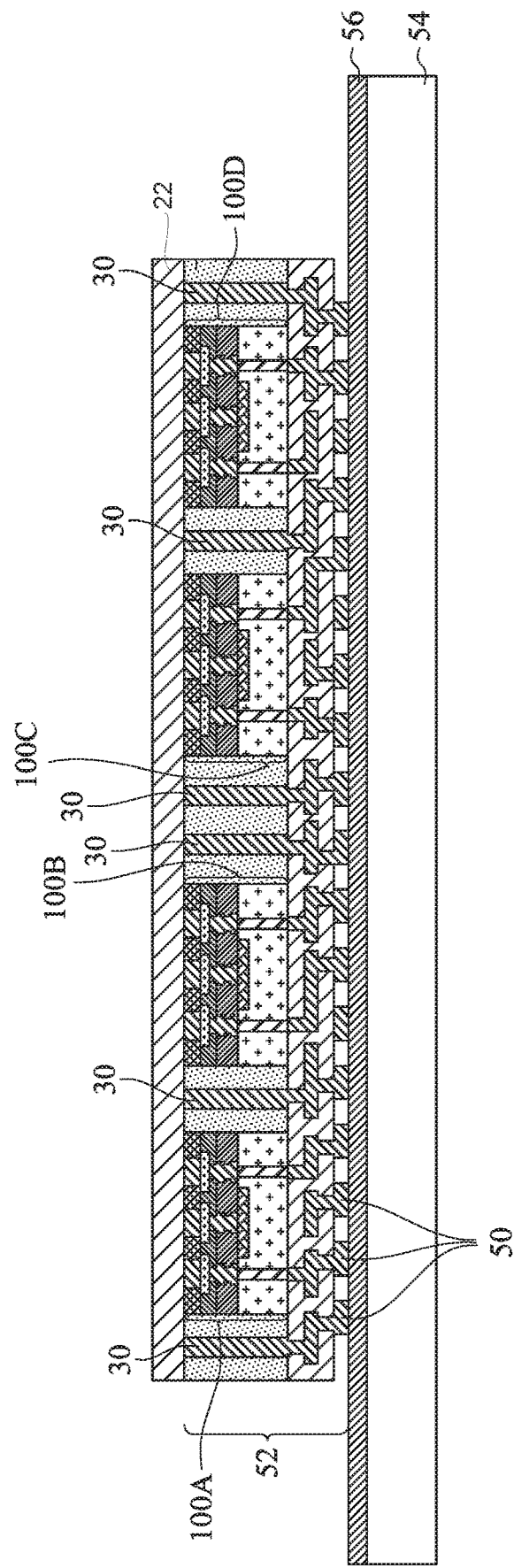

Next, a carrier-switch is performed, wherein carrier 54 (FIG. 9) is adhered to an opposite side of composite wafer 52 than carrier 20 (FIG. 8), followed by the demounting of carrier 20. The respective step is shown as step 210 in the process flow shown in FIG. 31. The de-bonding of composite wafer 52 from carrier 20 may be performed, for example, by projecting a UV light or a laser beam on the LTHC. The heat generated from the UV light or laser causes the LTHC to be decomposed, and hence carrier 20 is detached from composite wafer 52. The resulting structure is shown in FIG. 9. Base layer 22 is thus exposed. Composite wafer 52 may be mounted on carrier 54 through adhesive film 56.

Figure 10:
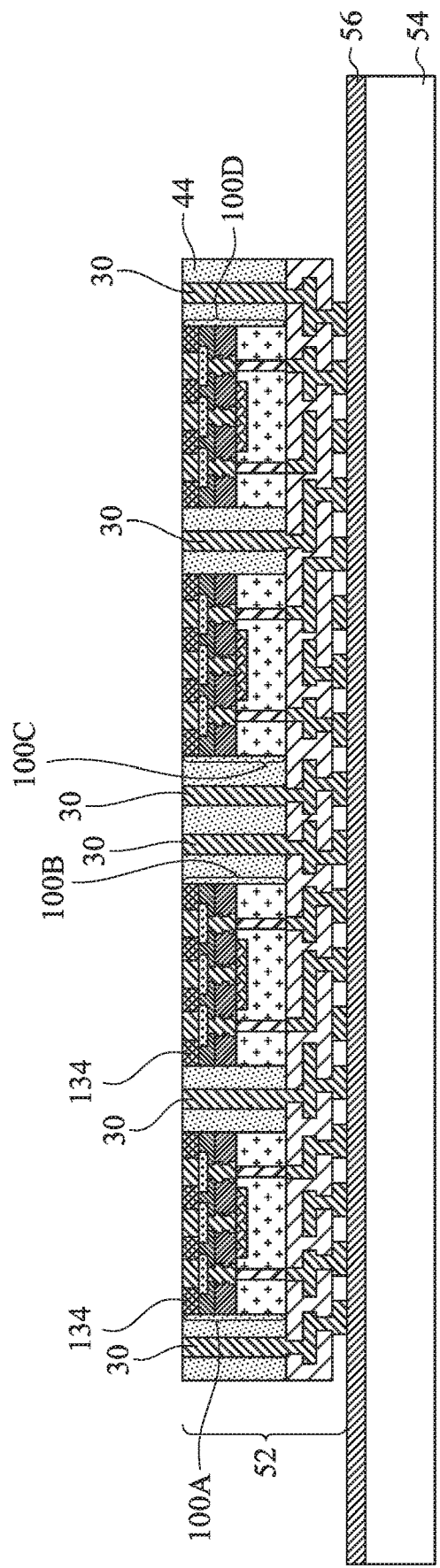
Figure 11:
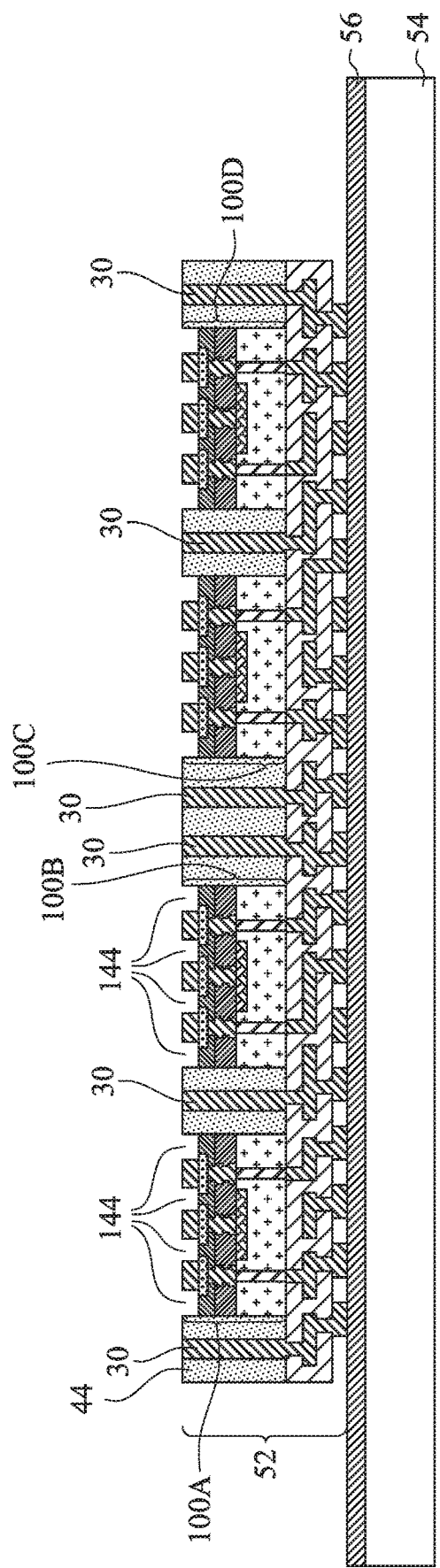
Figure 12:
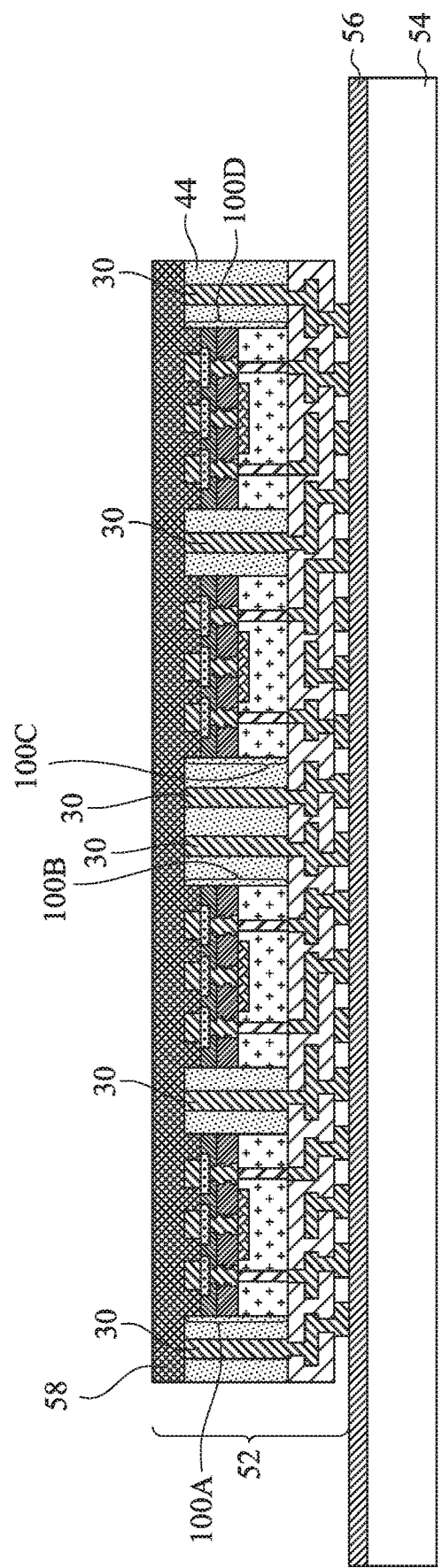
Figure 13:
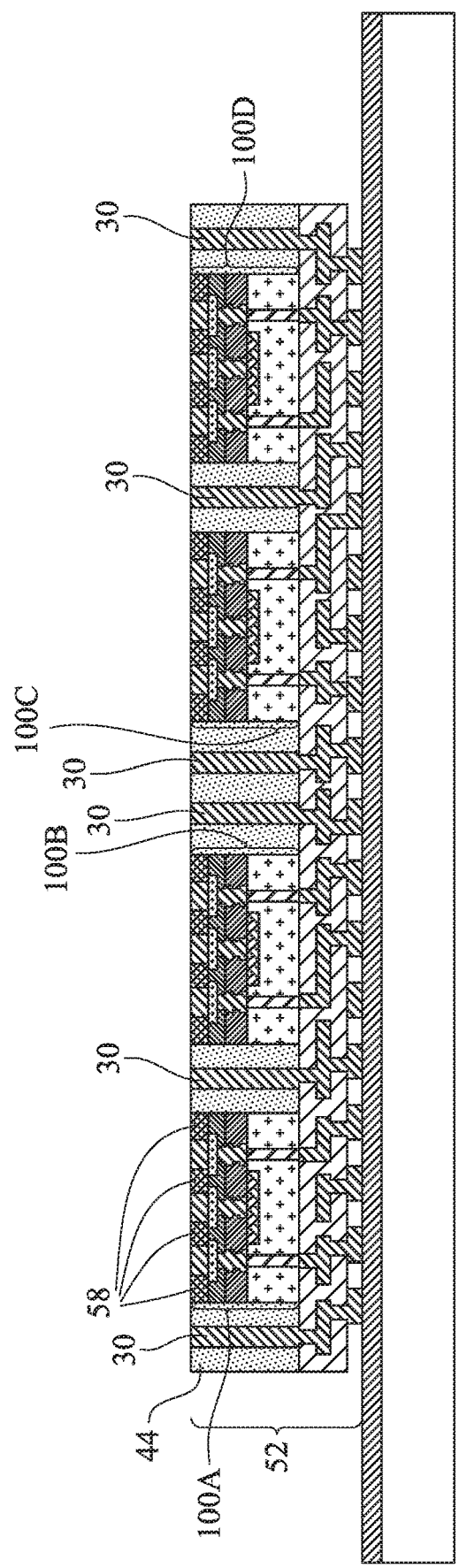

Base layer 22 is then removed, and the resulting structure is shown in FIG. 10, wherein die-attach films 134 are exposed. Next, FIGS. 11 through 13 illustrate the replacement of die-attach films 134 with dielectric layers 58. Referring to FIG. 11, die-attach films 134 (FIG. 1) are removed, for example, using a wet etching process. The respective step is shown as step 212 in the process flow shown in FIG. 31. Recesses 144 are thus formed. In FIG. 12, dielectric material 58 is disposed, wherein dielectric material 58 fills recesses 144, and may have some portions overlying dies 100. The respective step is shown as step 214 in the process flow shown in FIG. 31. In accordance with some embodiments, dielectric material 58 is formed of polybenzoxazole (PBO), polyimide, or the like. In a subsequent step, as shown in FIG. 13, a planarization such as grinding or CMP is performed to remove excess dielectric material 58. The top surfaces of the remaining dielectric material 58 are substantially coplanar with the top surface of encapsulating material 44 and the top surfaces of conductive posts 30. The remaining dielectric material 58, which now becomes parts of device dies 100, also has edges coterminus with (vertically aligned to) the respective edges of the underlying parts of device dies 100.

Figure 14:
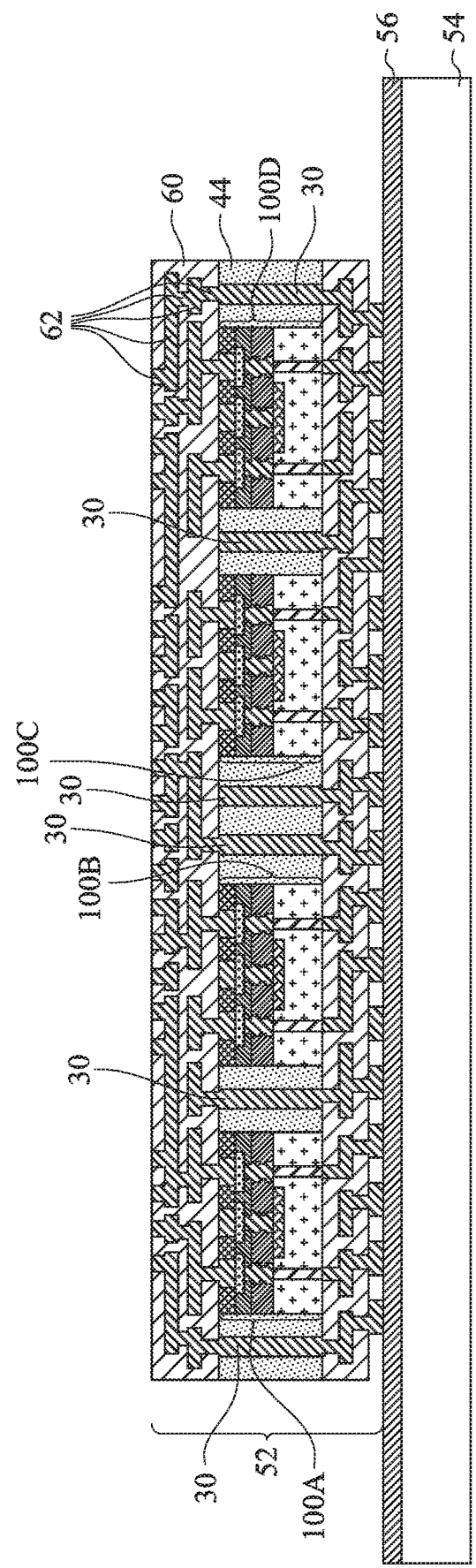
Figure 15:
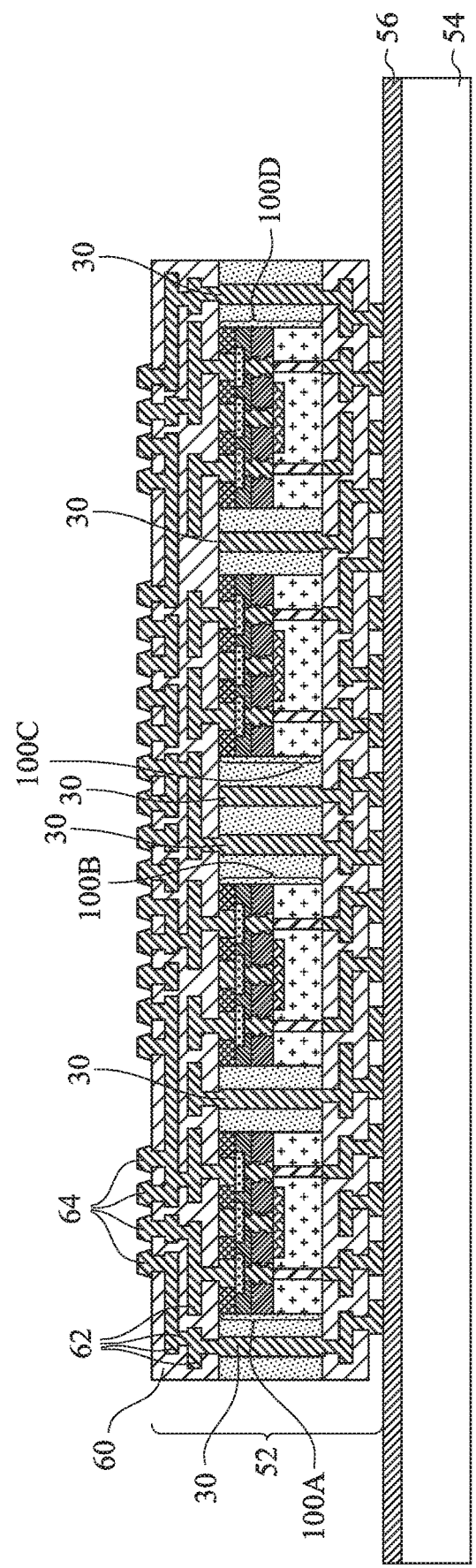

FIG. 14 illustrates the formation of dielectric layers 60 and RDLs 62 in dielectric layers 60. The respective step is shown as step 216 in the process flow shown in FIG. 31. The materials and the formation methods are essentially similar to the materials and the formation methods of dielectric layers 46 and RDLs 48, and hence are not repeated herein. In subsequent steps, as shown in FIG. 15, UBMs 64 are formed, which may be formed of similar materials as UBMs 50.

Figure 16:
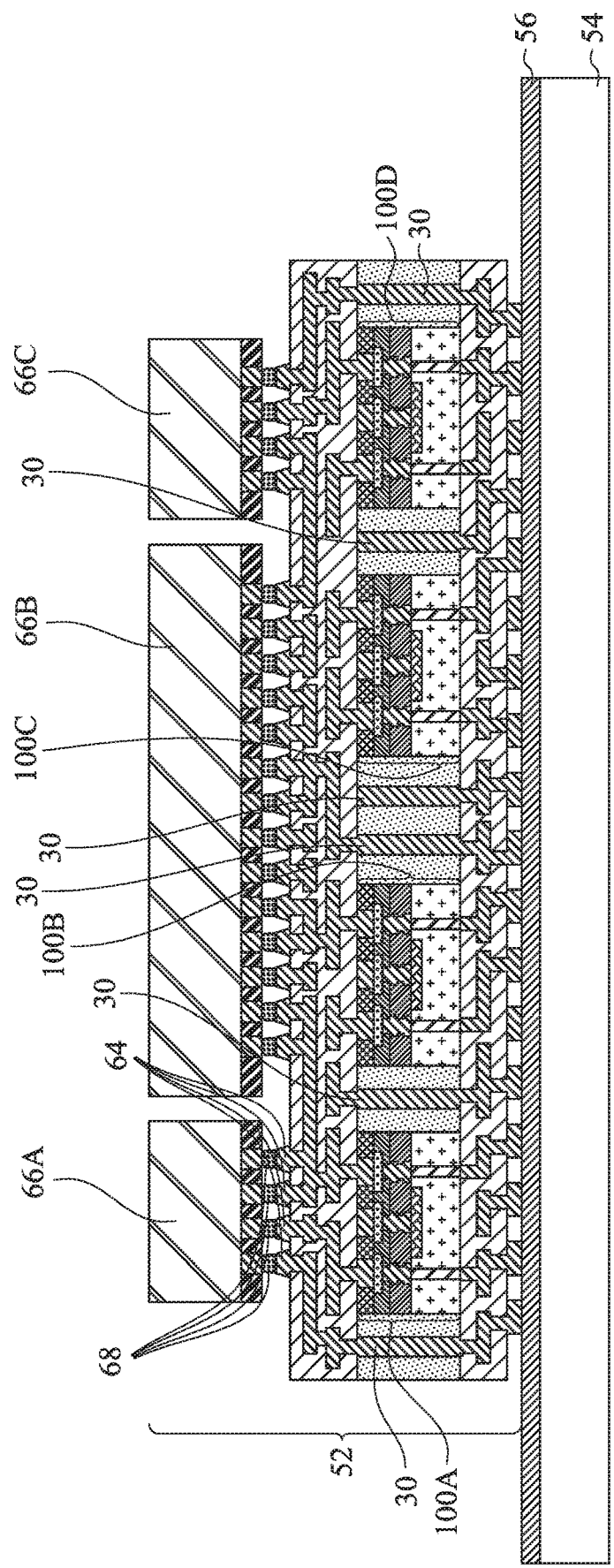

FIG. 16 illustrates the bonding of package components 66 (including 66A, 66B, and 66C, which are collectively referred to as package components 66) onto the exposed metal pads in RDLs 62. The respective step is shown as step 218 in the process flow shown in FIG. 31. Package components 66 may be bonded to UBMs 64 through solder regions 68. The bonding may also be achieved through metal-to-metal direct bonding (for example, through microbumps), hybrid bonding, fusion bonding, and/or the like. Each of package components 66 may be a package, a device die, or a die stack. For example, package component 66B may be a System-on-Chip (SOC) die, and package components 66A and 66C may be Central Processing Unit (CPU) dies, Graphic Processing Unit (GPU) dies, mobile application dies, memory dies, or die stacks. The memory dies may be in the form of High Bandwidth Memory (HBM) cubes. Package components 66 may have the respective semiconductor substrates (not shown) in the respective dies, with the semiconductor substrates having their back surfaces facing up. Package components 66 further include integrated circuit devices (such as active devices, which include transistors, for example, not shown) at the front surface (the surface facing down) of the respective semiconductor substrates.

In accordance with some embodiments, each of package components 66 is electrically connected to, and is supplied with voltages by, one of VR dies 100. In accordance with some embodiments, the package components 66 may be directly overlapping the respective VR dies 100 that supply voltages. For example, as shown in FIG. 16, device die 100A supplies and regulates the voltage supplies for package component 66A, device dies 100B and 100C supply and regulate the voltage supplies for package component 66B, and device die 100D supplies and regulates the voltage supplies for package component 66C. Some or all of device dies 100A, 100B/100C, and 100D may solely supply and regulate the voltage supplies of package components 66A, 66B, 66C, respectively, and do not supply and regulate the voltage supplies of other package components. By making package components 66 to be directly over their voltage suppliers, the lengths of the metal lines (RDLs 62) for connecting the VR dies 100 to the corresponding voltage users 66 are advantageously minimized, and the voltage drop caused by the resistance of the metal lines is advantageously minimized.

Figure 17:
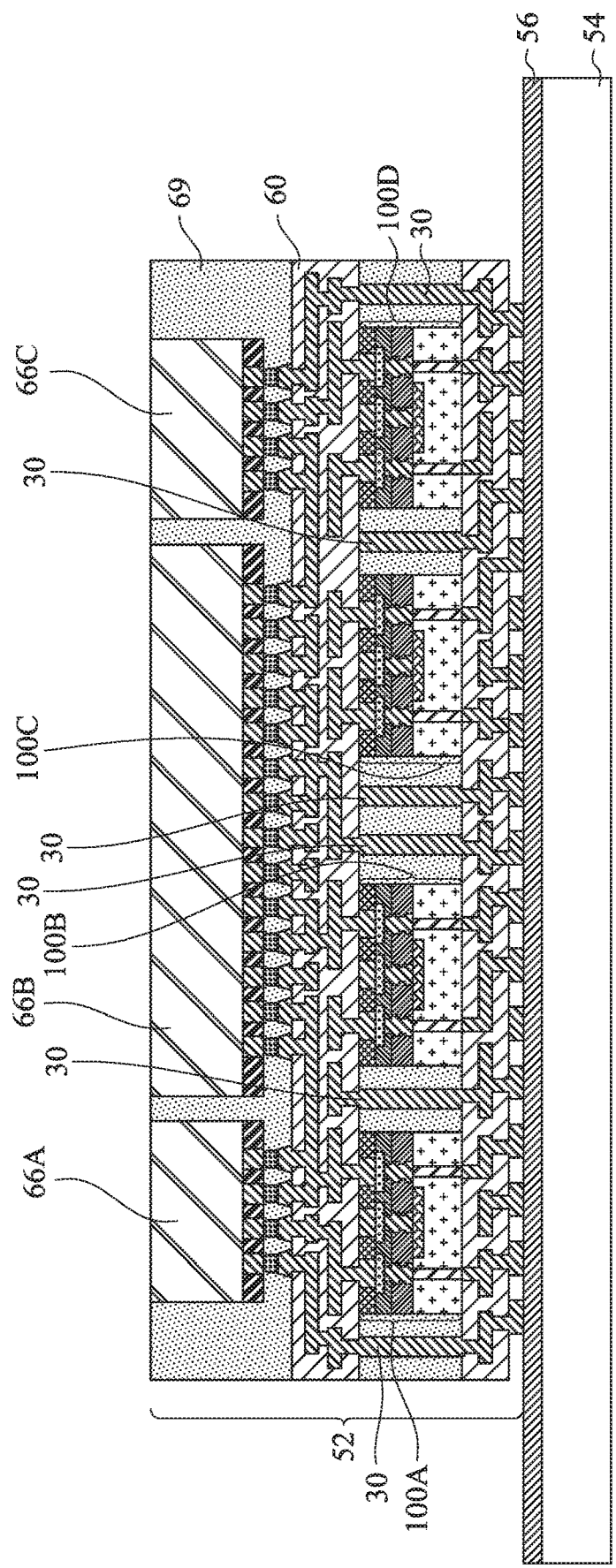

Referring to FIG. 17, encapsulating material 69 is encapsulated on package components 66. Encapsulating material 69 may include a molding compound, a molding underfill, an epoxy, or a resin. The bottom surface of encapsulating material 69 physically contacts the top surface of the top dielectric layer 60. After the dispensing, encapsulating material 69 is cured, for example, in a thermal curing process. In accordance with some embodiments of the present disclosure, a planarization step is performed to planarize encapsulating material 69, until the top surface of encapsulating material 69 is coplanar with the top surfaces of package components 66. The respective step is shown as step 220 in the process flow shown in FIG. 31.

Figure 18:
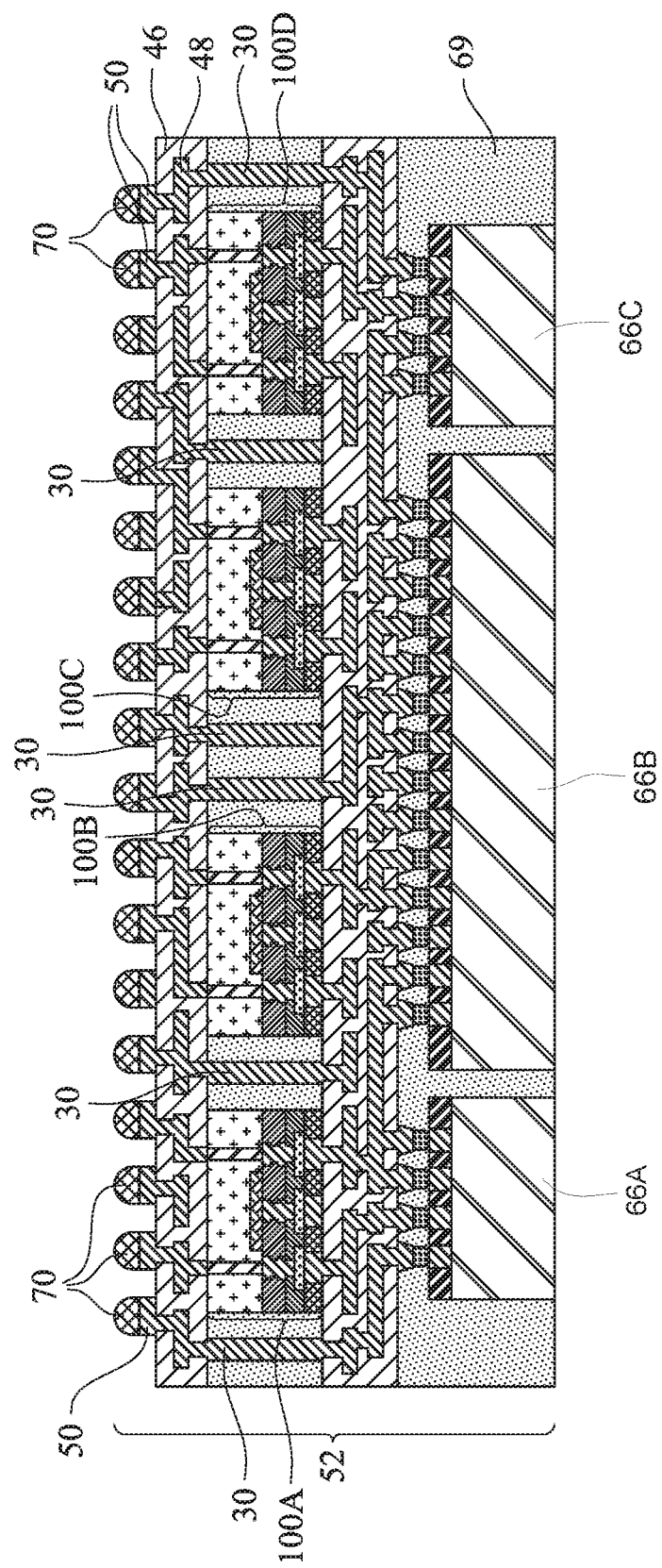

Next, composite wafer 52 is de-bonded from carrier 54. The resulting structure is shown in FIG. 18. Solder regions 70 may be formed on UBMs 50, for example, through solder dropping and reflowing.

Figure 19:
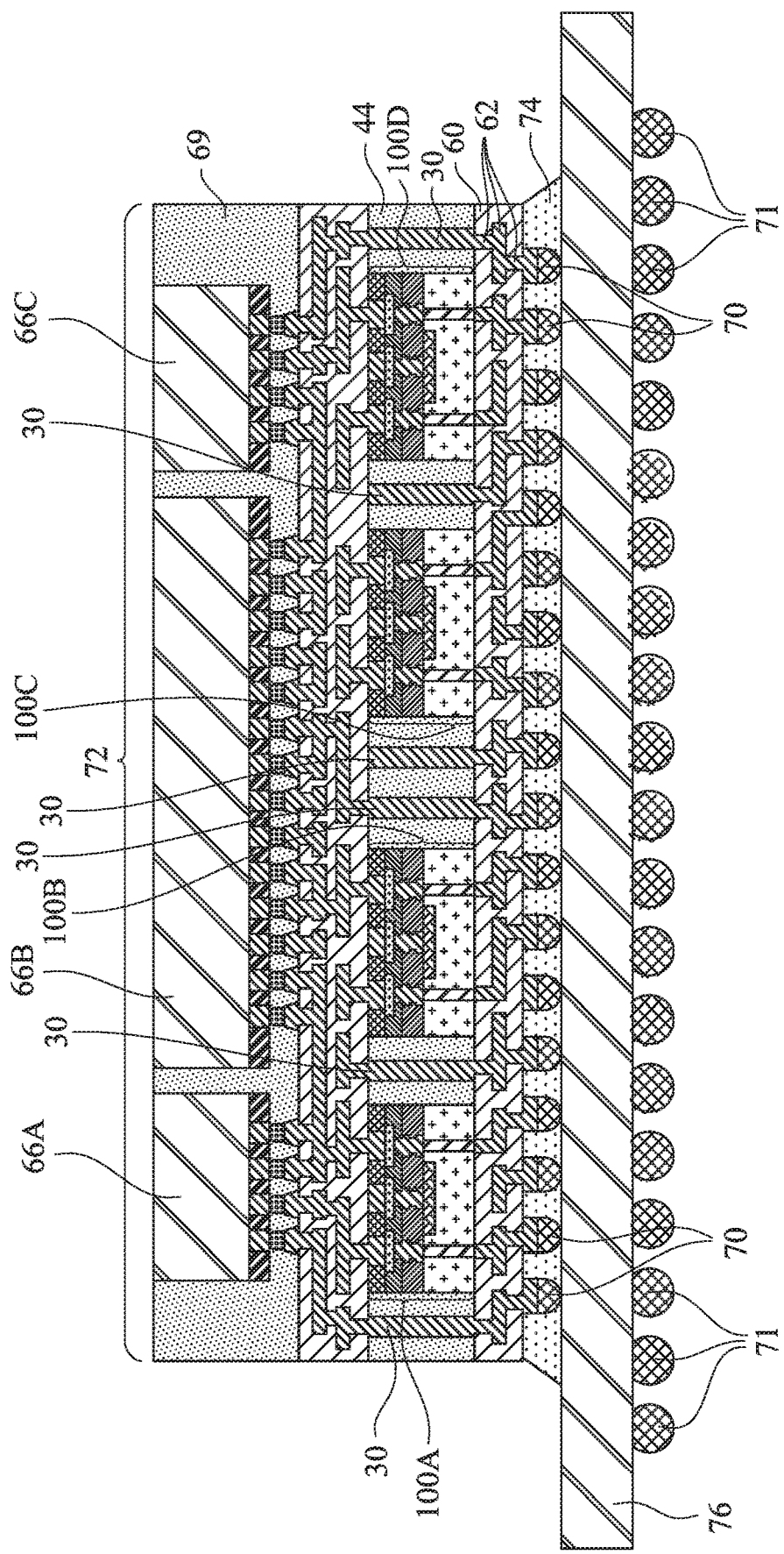

In a subsequent step, a die-saw is performed to saw composite wafer 52 into discrete packages 72, which are identical to each other, with one of discrete packages 72 illustrated in FIG. 19. The respective step is shown as step 222 in the process flow shown in FIG. 31. Since package 72 is sawed from composite wafer 52 (FIG. 18), the edges of encapsulating material 44 are vertically aligned to (coterminus with) the respective edges of encapsulating material 69. Furthermore, the edges of encapsulating material 44 are also vertically aligned to the respective edges of dielectric layers 46 and 60.

Further referring to FIG. 19, package 72 is bonded to package component 76. The respective step is also shown as step 222 in the process flow shown in FIG. 31. In accordance with some exemplary embodiments, the bonding is performed through solder regions 70. Package component 76 has metal lines and vias (not shown) built therein to interconnect the features on opposite sides of package component 76. Package component 76 may be a package substrate, which is a laminate substrate (core-less) or may have cores. Package component 76 may also be an interposer, which includes RDLs formed on a semiconductor substrate, with through-vias (not shown) penetrating through the semiconductor substrate. The conductive traces and/or cores (not shown) in package component 76 are electrically connected to solder regions 70 and 71. Underfill 74 is then dispensed to protect the bonding.

Figure 20:
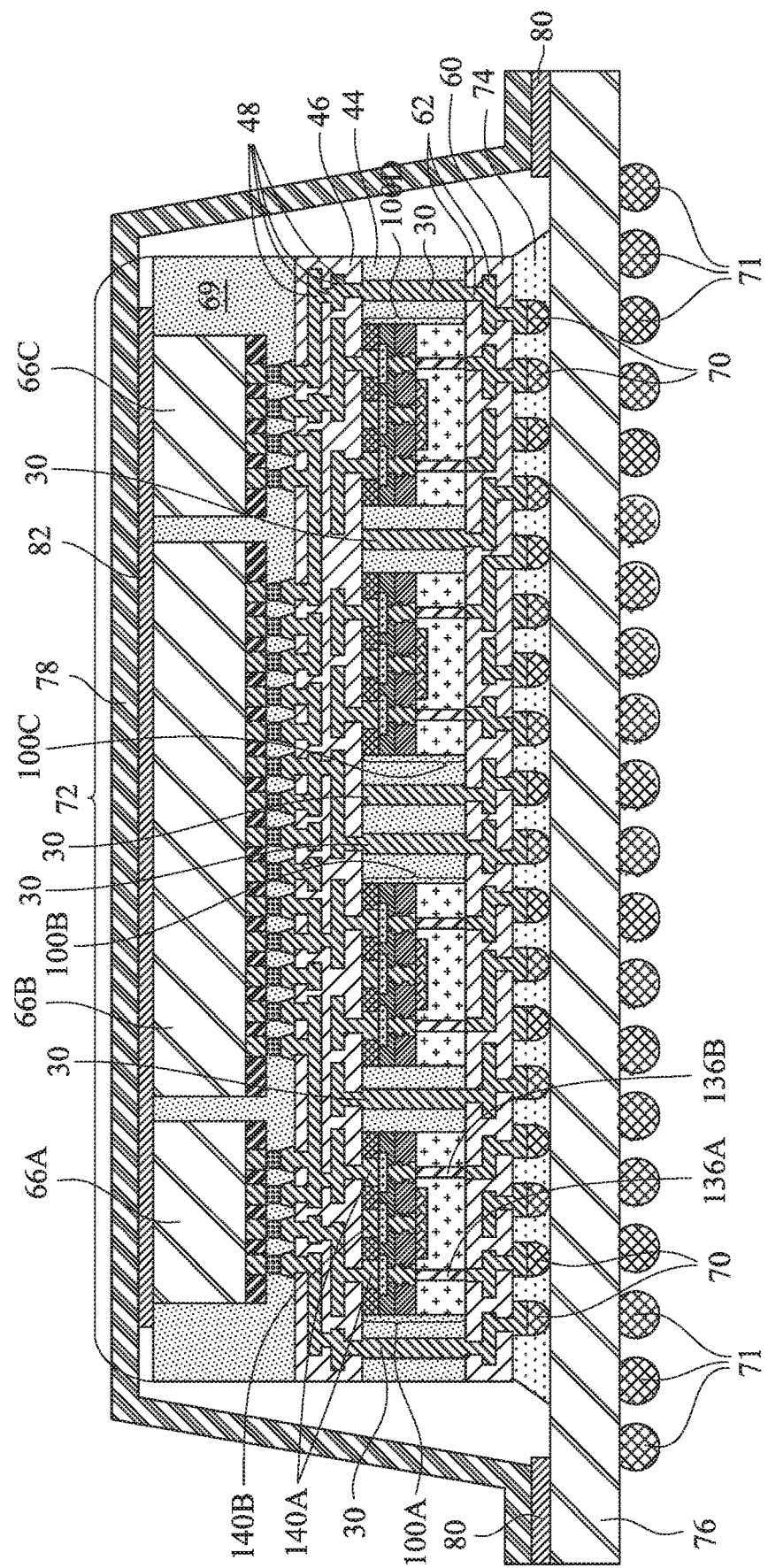

Referring to FIG. 20, heat spreader 78 is adhered to package components 72 through Thermal Interface Material (TIM) 82, which is adhesive, and has a thermal conductivity higher than the thermal conductivity of typical adhesives. The respective step is shown as step 224 in the process flow shown in FIG. 31. Heat spreader 78 may also be fixed onto package component 76 through adhesive 80.

FIGS. 21 through 30 illustrate the cross-sectional views of intermediate stages in the formation of a fan-out package in accordance with some embodiments of the present disclosure. Unless specified otherwise, the materials and the formation methods of the components in these embodiments are essentially the same as the like components, which are denoted by like reference numerals in the embodiments shown in FIGS. 1 through 20. The details regarding the formation process and the materials of the components shown in FIGS. 21 through 30 may thus be found in the discussion of the embodiments shown in FIGS. 1 through 21. The process shown in FIGS. 21 through 30 is similar to the process shown in FIGS. 1 through 20, except metal pillar 140 (refer to 140A and 140B in FIG. 20) are not pre-formed in device dies 100. Rather, metal pillars 140 are formed after the capsulation of device dies 100.

Figure 21:
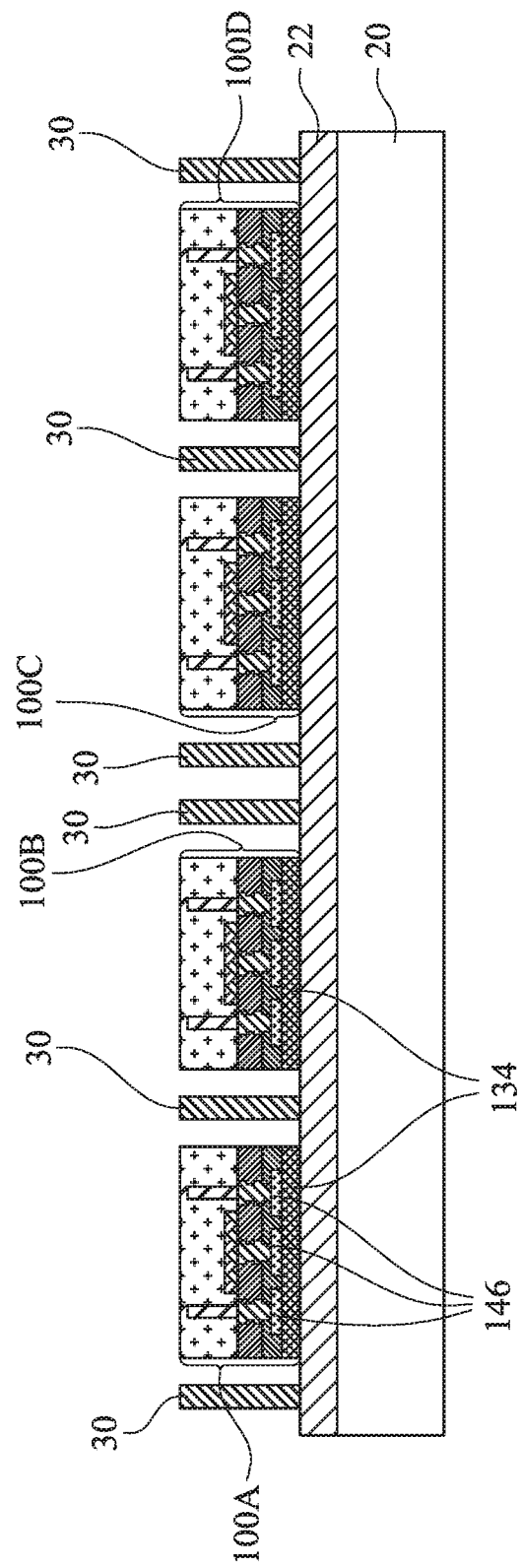
FIGS. 21 through 30 illustrate the cross-sectional views of intermediate stages in the formation of a package including voltage regulators in accordance with some embodiments.
Figure 22:
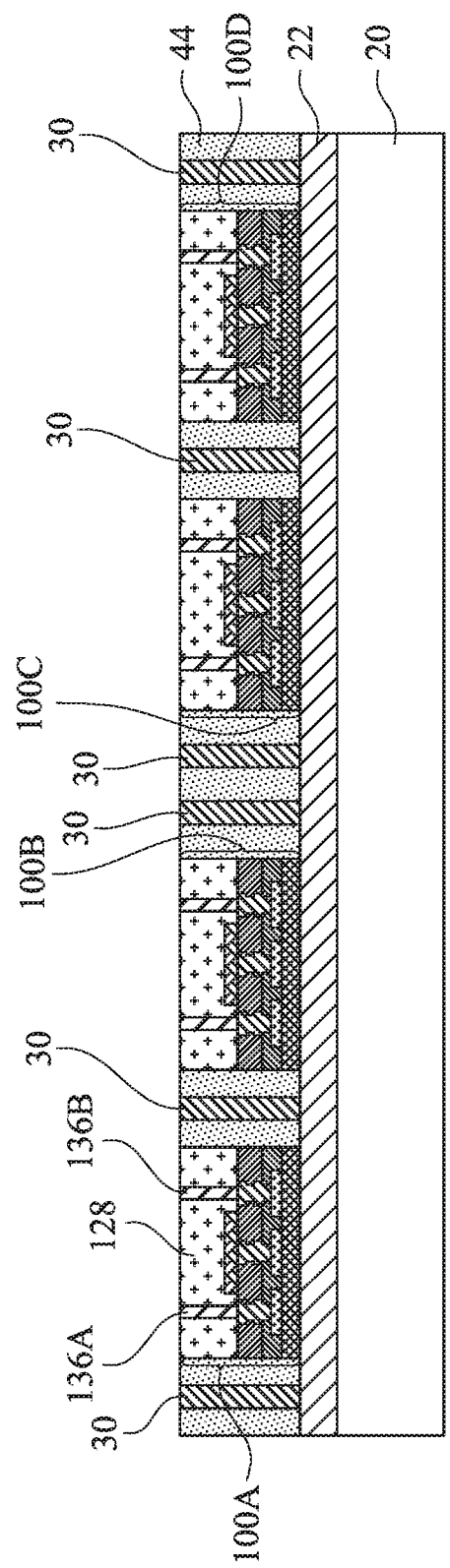
Figure 23:
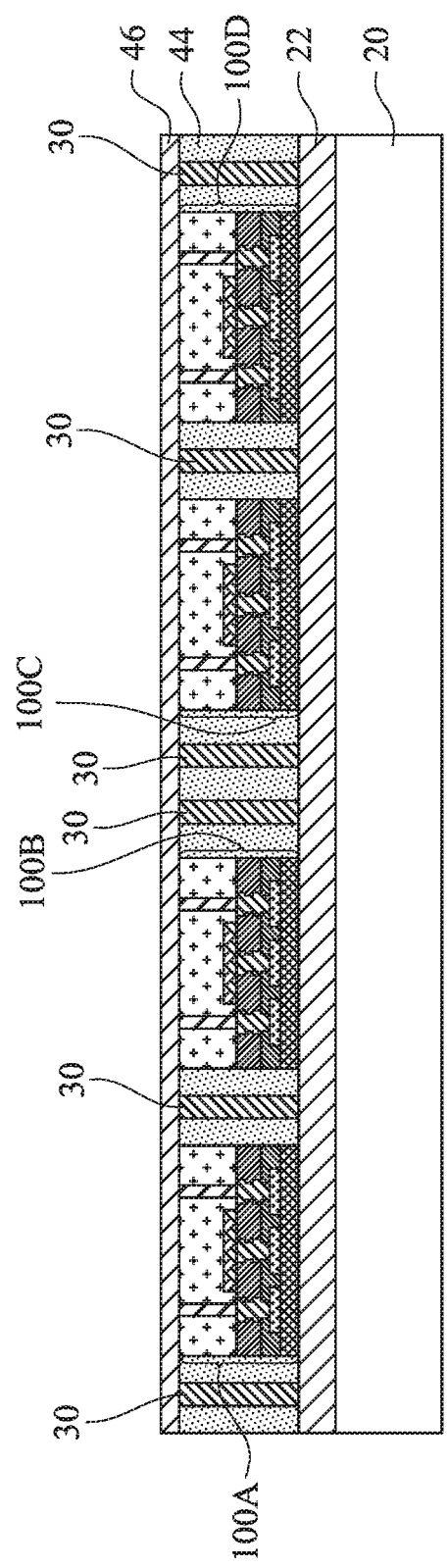
Figure 24:
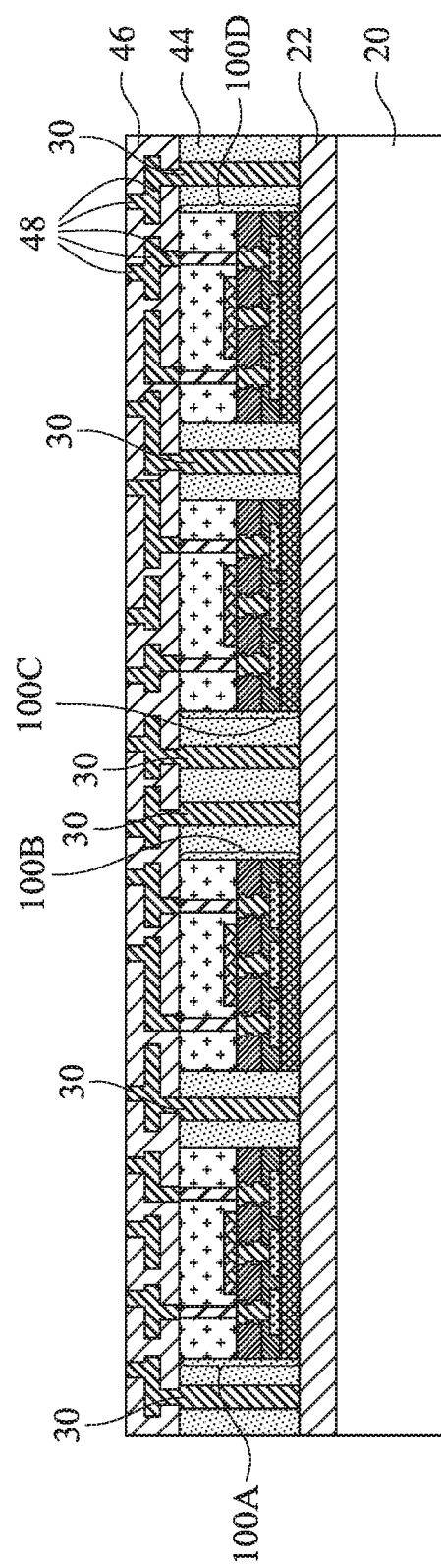
Figure 25:
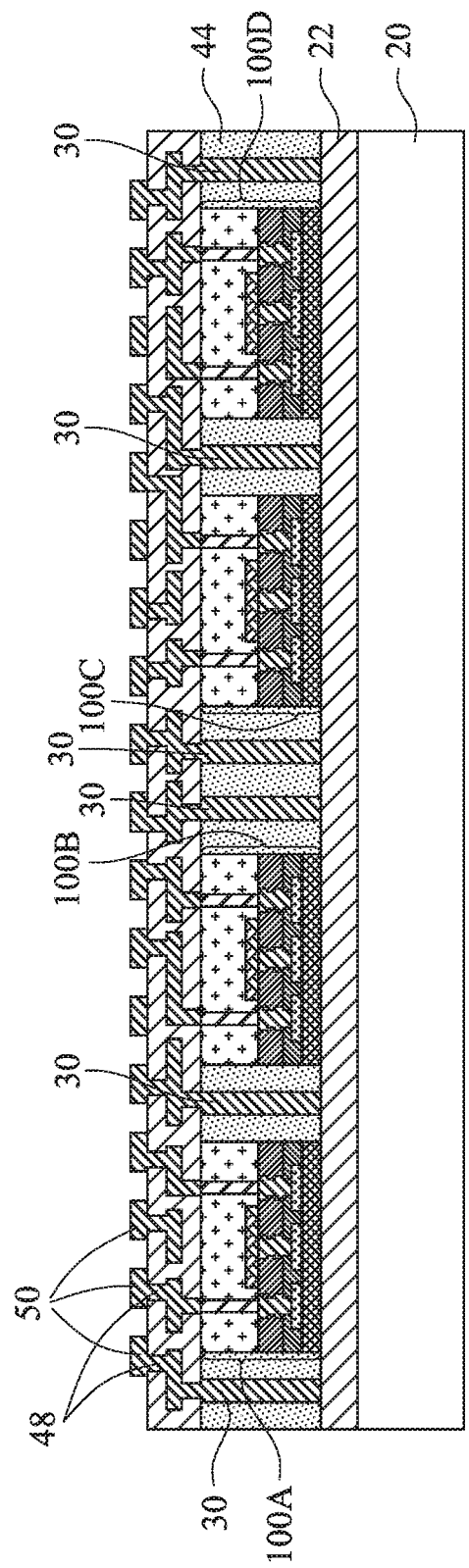
Figure 26:
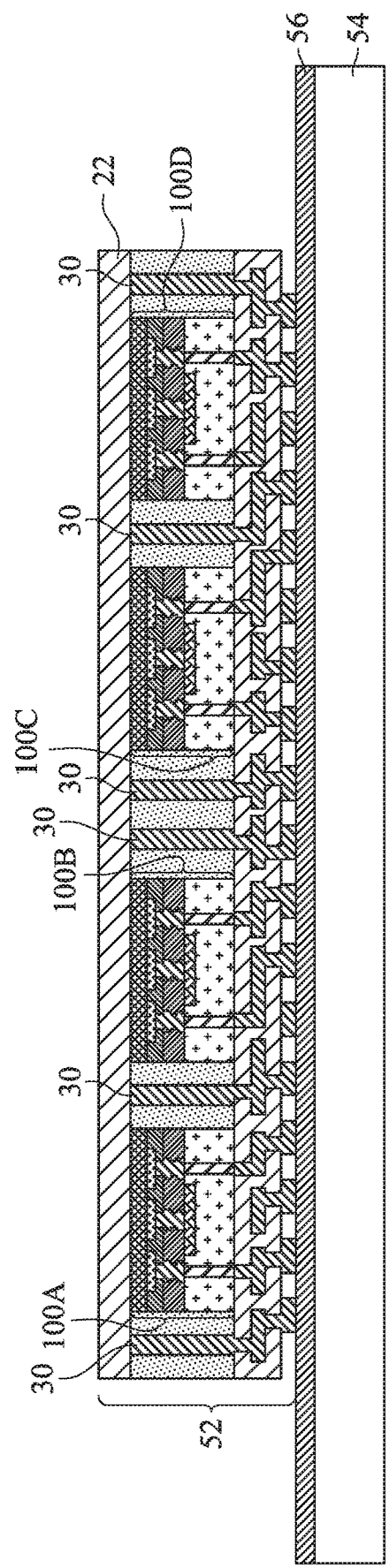
Figure 27:
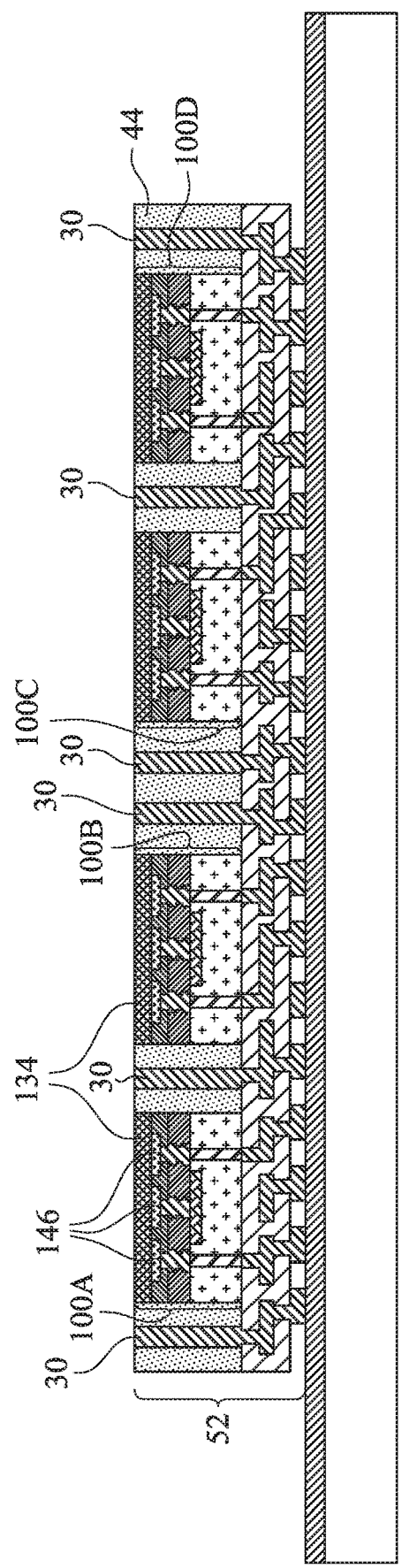

The initial steps of these embodiments are essentially the same as shown in FIGS. 1 through 3. Next, as shown in FIG. 21, device dies 100 are adhered to base layer 22. Device dies 100 as shown in FIG. 21 are essentially the same as what are shown in FIG. 4, except that metal pillars 140 (including 140A and 140B as in FIG. 20) are not formed in the device dies 100 as shown in FIG. 21. Accordingly, die-attach films 134 in FIG. 21 are blanket films, and no conductive features such as metal pads 146 are exposed to contact base layer 22. The subsequent process steps as shown in FIGS. 22 through 27 are essentially the same as the process steps as shown in FIGS. 5 through 10. For example, FIG. 22 illustrates the dispensing and the planarization of encapsulating material 44. FIGS. 23 through 25 illustrate the formation of dielectric layers 46, RDLs 48, and UBMs 50. FIG. 26 illustrates the carrier switching, followed by the removal of base layer 22, wherein the resulting structure is shown in FIG. 27.

Figure 28:
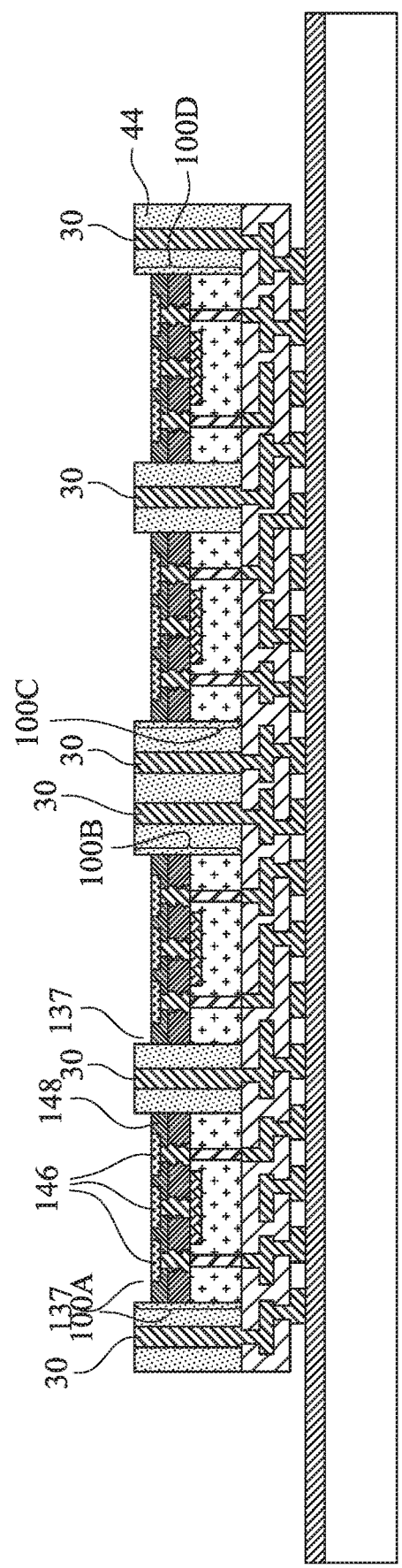
Figure 29:
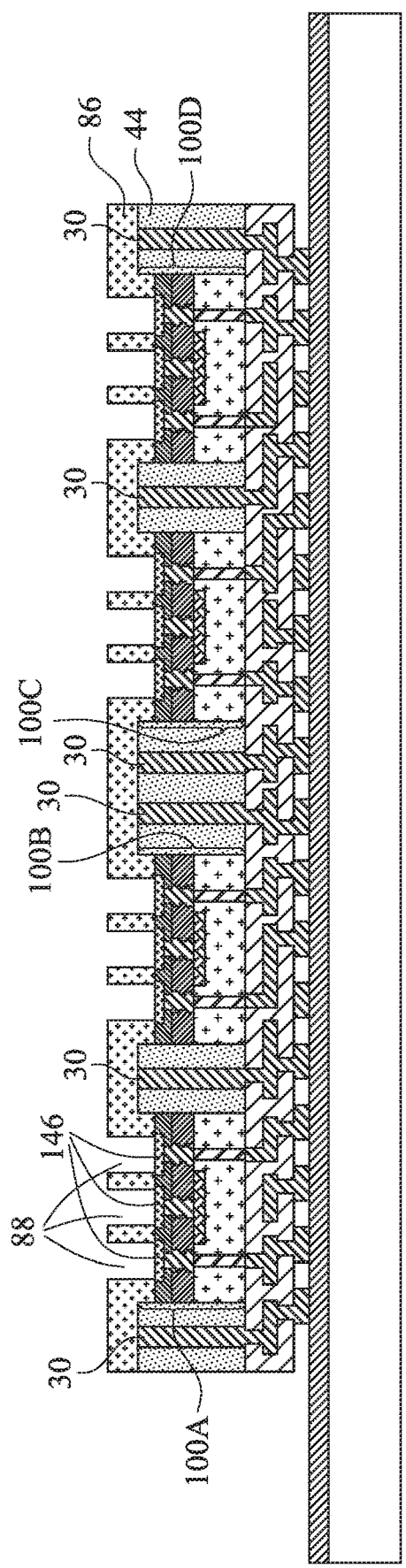
Figure 30:
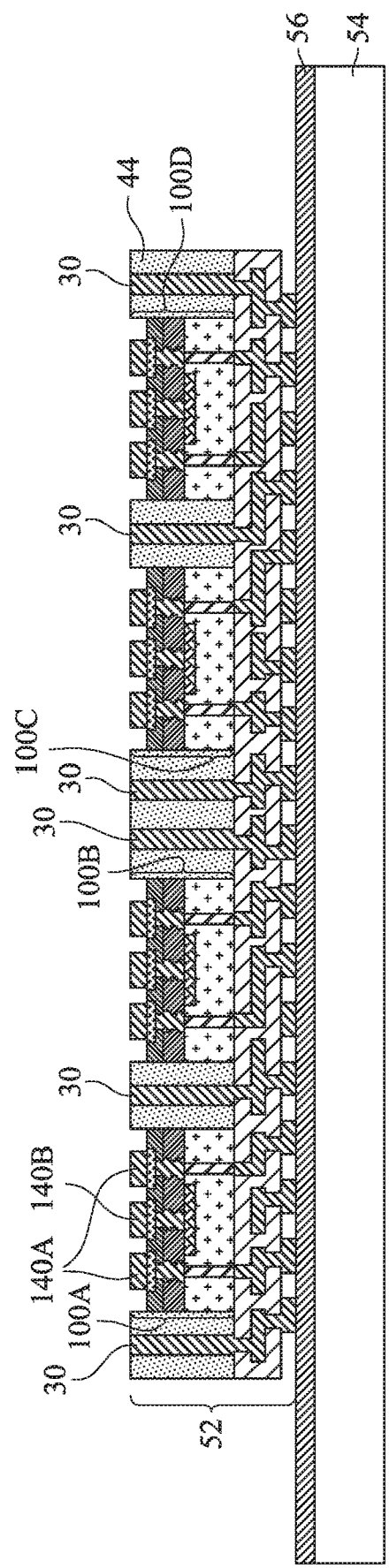

Next, die-attach films 134 are removed, forming recesses 137 as shown in FIG. 28. Dielectric layer 148 and the center portions of metal pads 146 are exposed to recesses 137. The edge portions of metal pads 146 are covered by dielectric layers 148. In FIG. 29, photo resist 86 is formed and patterned, wherein metal pads 146 are exposed to openings 88 formed in photo resist 86. Next, a plating step is performed to form metal pillars 140 (including 140A and 140B), followed by the removal of photo resist 86, and the resulting structure is shown in FIG. 30. The subsequent steps are essentially the same as shown in FIGS. 12 through 20, and hence are not repeated herein.

The embodiments of the present disclosure have some advantageous features. By placing VR dies directly underlying the corresponding device dies (such as 66A) that are supplied with the voltages, the distances from the device dies to their voltage regulators is minimized. The resistance of the metal lines is reduced, and the power efficiency is improved. As a comparison, if VR dies are placed aside of the core chips, the metal lines are much longer, and the voltage drop due to the resistance of the metal lines is high. Furthermore, the layout is unbalanced since the VR dies are closer to some of the voltage users and farther away from other voltage users. In accordance with the embodiments of the present disclosure, VR dies are placed directly underlying the device dies that the VR dies 100 serve, the layout is thus balanced.

In accordance with some embodiments of the present disclosure, a method includes adhering a voltage regulator die over a carrier through a die-attach film, with the die-attach film being in the voltage regulator die and encircles metal pillars of the voltage regulator die, encapsulating the voltage regulator die in an encapsulating material, and planarizing the encapsulating material. A back portion of the voltage regulator die is removed to expose a through-via in a semiconductor substrate of the voltage regulator die. The method further includes forming first dielectric layers over the voltage regulator die and the encapsulating material, forming first redistribution lines in the first dielectric layers, wherein portions of the first redistribution lines are electrically coupled to the through-via, replacing the die-attach film with a dielectric material, forming second dielectric layers, wherein the first and the second dielectric layers are on opposite sides of the voltage regulator die, forming second redistribution lines in the second dielectric layers, and bonding an additional device die to the second redistribution lines, with the voltage regulator die electrically coupled to the additional device die.

In accordance with some embodiments of the present disclosure, a method includes forming a base layer over a carrier, forming a conductive post over the base layer, and adhering a voltage regulator die to the base layer. The voltage regulator die includes a die-attach film, and the die-attach film is adhered to the base layer. The method further includes encapsulating the voltage regulator die and the conductive post in an encapsulating material, planarizing the encapsulating material until the voltage regulator die and the conductive post are exposed, forming first dielectric layers over the voltage regulator die and the encapsulating material, forming first redistribution lines in the first dielectric layers, wherein portions of the first redistribution lines are electrically coupled to the conductive post, and replacing the die-attach film with a dielectric material, forming second dielectric layers. The first and the second dielectric layers are on opposite sides of the voltage regulator die. Second redistribution lines are formed in the second dielectric layers. An additional device die is bonded to the second redistribution lines.

In accordance with some embodiments of the present disclosure, a package includes a voltage-regulator die, which further includes a semiconductor substrate, a through-via penetrating through the semiconductor substrate, and a metal pillar at a top surface of the voltage-regulator die. The package further includes a first encapsulating material encapsulating the voltage-regulator die therein, and a first plurality of redistribution lines over the voltage-regulator die and the first encapsulating material. Portions of the first plurality of redistribution lines are in physical contact with the through-via and the metal pillar. A device die is bonded to the first plurality of redistribution lines. A second plurality of redistribution lines is underlying the first encapsulating material. The second plurality of redistribution lines is electrically coupled to the first plurality of redistribution lines.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method of forming a package, the method comprising:
   encapsulating a first device die in an encapsulant, wherein the first device die comprises a die-attach film;
   removing the die-attach film to leave a recess in the encapsulant, wherein a metal pad of the first device die is exposed to the recess;
   plating a metal pillar in the recess and on the metal pad;
   filling a dielectric material in the recess, wherein the dielectric material encircles the metal pillar; and
   forming first redistribution lines over and electrically coupling to the first device die; and
   bonding a second device die to the first redistribution lines, with the first device die electrically coupling to the second device die.

2. The method of claim 1, wherein before the die-attach film is removed, an entirety of the metal pad is covered by the die-attach film.

3. The method of claim 1 further comprising, after the dielectric material is filled in the recess, performing a planarization process to level top surfaces of the dielectric material, the metal pillar, and the encapsulant.

4. The method of claim 1, wherein the encapsulating the first device die comprises encapsulating a voltage regulator die.

5. The method of claim 1 further comprising:
   forming a plating mask, wherein a portion of the plating mask extends into the recess, and a portion of the metal pad is exposed through an opening in the plating mask, and the metal pillar is plated in the opening.

6. The method of claim 5 further comprising, before the dielectric material is filled in the recess, removing the plating mask.

7. The method of claim 1 further comprising:
   planarizing the encapsulant, wherein a back portion of the first device die is removed to expose a through-via in a semiconductor substrate of the first device die; and
   forming an additional redistribution line electrically coupling to the through-via.

8. The method of claim 7, wherein the through-via is electrically disconnected from all circuits in the first device die.

9. A method of forming a package, the method comprising:
   adhering a voltage regulator die to a base layer, wherein the base layer is over a first carrier, wherein the voltage regulator die comprises a sacrificial layer and metal pads covered by the sacrificial layer, and wherein a surface of the sacrificial layer is attached to the base layer;
   encapsulating the voltage regulator die in an encapsulant;
   performing a carrier-switch to adhere a second carrier on an opposite side of the voltage regulator die than the first carrier;
   de-mounting the first carrier from the voltage regulator die;
   removing the sacrificial layer to reveal the metal pads;
   forming metal pillars on the metal pads; and filling spaces between the metal pillars with a dielectric material.

10. The method of claim 9 further comprising:
performing a planarization process to level top surfaces of the metal pillars with a top surface of the encapsulant;
forming redistribution lines electrically coupling to the metal pillars; and
bonding a device die to the redistribution lines.

11. The method of claim 9, wherein before the voltage regulator die is placed on the first carrier, no electrical conductive feature in the voltage regulator die is exposed through the sacrificial layer.

12. The method of claim 9, wherein the forming the metal pillars comprises:
forming a plating mask, wherein a portion of the plating mask extends into a recess left by the removed sacrificial layer;
patterning the plating mask to form openings, wherein the metal pads are revealed through the openings; and
plating the metal pillars in the openings.

13. The method of claim 9, wherein after the carrier-switch, the base layer is adhered to the sacrificial layer, and the method further comprises performing a planarization process to level a top surface of the dielectric material with a surface of the encapsulant.

14. The method of claim 9 further comprising forming a conductive post over the base layer, wherein the conductive post is encapsulated by the encapsulant.

15. The method of claim 9, wherein the voltage regulator die comprises:
a semiconductor substrate; and
a through-via penetrating through the semiconductor substrate, wherein the through-via is electrically coupled to one of the metal pads, and the through-via is electrically de-coupled from all integrated circuits in the voltage regulator die.

16. The method of claim 9, wherein the voltage regulator die is configured to regulate voltage supplies of the device die.

17. A method of forming a package, the method comprising:
encapsulating a voltage regulator die in an encapsulant, wherein the voltage regulator die comprises:
a semiconductor substrate;
a through-via penetrating through the semiconductor substrate; and
a die-attach film;
removing the die-attach film to leave a recess in the encapsulant;
applying a photo resist to cover the voltage regulator die and the encapsulant;
patterning the photo resist to form openings;
plating a metal pillar in the openings, wherein the metal pillar is electrically connected to the through-via;
removing the photo resist;
applying a dielectric material to fill the recess;
performing a planarization process to level top surfaces of the dielectric material, the metal pillar, and the encapsulant;
forming redistribution lines to electrically couple to the through-via and the metal pillar; and
bonding an additional device die over the redistribution lines, wherein the voltage regulator die is electrically coupled to the additional device die.

18. The method of claim 17, wherein the photo resist extends into the recess.

19. The method of claim 17, wherein an entirety of the die-attach film is removed.

20. The method of claim 17, wherein after the die-attach film is removed, edges of the encapsulant facing the recess are flush with corresponding edges of the voltage regulator die.

* * * * *